United States Patent
Pokharna et al.

(10) Patent No.: US 11,744,044 B2
(45) Date of Patent: Aug. 29, 2023

(54) LOOP THERMOSYPHON DEVICES AND SYSTEMS, AND RELATED METHODS

(71) Applicant: Deeia Inc., Saratoga, CA (US)

(72) Inventors: Himanshu Pokharna, Saratoga, CA (US); Gin Hwee Tan, New Taipei (TW)

(73) Assignee: Deeia, Inc., Saratoga, CA (US)

(*) Notice: Subject to any disclaimer, the term of this patent is extended or adjusted under 35 U.S.C. 154(b) by 0 days.

(21) Appl. No.: 17/520,597

(22) Filed: Nov. 5, 2021

(65) Prior Publication Data
US 2022/0142001 A1 May 5, 2022

Related U.S. Application Data

(60) Provisional application No. 63/110,335, filed on Nov. 5, 2020.

(51) Int. Cl.
*F28D 15/00* (2006.01)
*H05K 7/20* (2006.01)
(Continued)

(52) U.S. Cl.
CPC ..... *H05K 7/20327* (2013.01); *F28D 15/0266* (2013.01); *F28D 15/0275* (2013.01);
(Continued)

(58) Field of Classification Search
CPC ........... H05K 7/20327; H05K 7/20309; H05K 7/20318; H05K 7/20245; H05K 7/20336;
(Continued)

(56) References Cited

U.S. PATENT DOCUMENTS

| 4,903,761 A | 2/1990 | Cima |
| 6,729,389 B2* | 5/2004 | Ohashi .................. F28D 1/0383 |
| | | 257/E23.098 |

(Continued)

FOREIGN PATENT DOCUMENTS

| EP | 2552182 | 1/2013 |
| EP | 2238400 | 2/2018 |
| KR | 102291447 | 8/2021 |

OTHER PUBLICATIONS

Fasula, Christopher, "Oscillating Heat Pipes (OHP)," A Special Problems Paper Submitted in Partial Fulfillment of the Requirements for the Degree of Masters of Science in Mechanical Engineering and Applied Mechanics, May 2009, 46 pages, University of Rhode Island, United States.
(Continued)

*Primary Examiner* — Travis Ruby
(74) *Attorney, Agent, or Firm* — Ganz Pollard, LLC

(57) ABSTRACT

A loop thermosyphon can combine the best of heat-pipes and traditional liquid-cooling systems that include a mechanical pump. A disclosed heat-transfer device includes a first heat-transfer component and a second heat-transfer component fluidly coupled with each other by a first conduit and a second conduit. A first manifold is positioned in the first heat-transfer component and defines a first plurality of liquid pathways. The first manifold fluidly couples with the first conduit. A second manifold is also positioned in the first heat-transfer component and defines a second plurality of liquid pathways fluidly coupled with and extending from the first plurality of liquid pathways. The second manifold further defines a plurality of boiling channels, a plurality of accumulator channels and a vapor manifold. The boiling channels extend transversely relative to and are fluidly coupled with the second plurality of liquid pathways. The plurality of accumulator channels extends transversely rela-
(Continued)

tive to and are fluidly coupled with the plurality of boiling channels. The vapor manifold is configured to collect vapor from one or more of the plurality of boiling channels, one or more of the plurality of accumulator channels, or both. The first heat-transfer component further defines an outlet fluidly coupling the vapor manifold with the second conduit. Electrical devices incorporating such a heat-transfer device also are disclosed, as well as associated methods.

29 Claims, 10 Drawing Sheets

(51) Int. Cl.
   *F28D 15/02* (2006.01)
   *F28D 15/04* (2006.01)
(52) U.S. Cl.
   CPC ....... *F28D 15/043* (2013.01); *H05K 7/20309* (2013.01); *H05K 7/20318* (2013.01); *H05K 7/20245* (2013.01)
(58) Field of Classification Search
   CPC ............ F28D 15/0266; F28D 15/0275; F28D 15/043; F28D 15/04; F28F 2215/04; F28F 2215/08
   See application file for complete search history.

(56) References Cited

U.S. PATENT DOCUMENTS

| | | | |
|---|---|---|---|
| 7,516,777 B2* | 4/2009 | Terakado | F28F 3/12 165/170 |
| 7,836,597 B2* | 11/2010 | Datta | H01L 21/4882 29/890.032 |
| 7,931,072 B1* | 4/2011 | Kroliczek | F25B 39/02 165/104.21 |
| 8,627,879 B2 | 1/2014 | Rosenfeld et al. | |
| 9,113,578 B2* | 8/2015 | Cottet | H05K 7/20936 |
| 9,157,687 B2* | 10/2015 | Schon | F28D 15/043 |
| 9,453,691 B2* | 9/2016 | Lyon | F28F 3/12 |
| 9,795,058 B2* | 10/2017 | Tsai | H05K 7/20272 |
| 10,443,960 B2* | 10/2019 | Wan | F28F 3/025 |
| 10,746,479 B2 | 8/2020 | Rush et al. | |
| 2003/0051859 A1 | 3/2003 | Chesser et al. | |
| 2003/0070792 A1* | 4/2003 | Tanaka | F28F 9/0221 165/104.21 |
| 2003/0079863 A1* | 5/2003 | Sugito | H05K 7/1418 257/E23.098 |
| 2004/0206477 A1* | 10/2004 | Kenny | F04B 17/00 257/E23.098 |
| 2005/0099775 A1* | 5/2005 | Pokharna | H01L 23/473 257/E23.098 |
| 2005/0172644 A1 | 8/2005 | Zhang et al. | |
| 2005/0279491 A1* | 12/2005 | Thome | F28D 15/06 165/96 |
| 2006/0157227 A1* | 7/2006 | Choi | H01L 23/427 165/104.21 |
| 2008/0216991 A1* | 9/2008 | Oikawa | G06F 1/20 257/E23.098 |
| 2008/0264604 A1* | 10/2008 | Campbell | H01L 23/427 165/80.4 |
| 2009/0071625 A1 | 3/2009 | Lyon | |
| 2010/0012294 A1* | 1/2010 | Bezama | H01L 23/3672 165/80.4 |
| 2010/0032150 A1 | 2/2010 | Determan et al. | |
| 2012/0018130 A1* | 1/2012 | Chang | F28F 3/048 165/104.21 |
| 2012/0024499 A1* | 2/2012 | Chang | F28F 13/06 165/104.34 |
| 2012/0181005 A1* | 7/2012 | Downing | F28F 3/086 165/170 |
| 2014/0083652 A1* | 3/2014 | Matsunaga | H01L 23/10 165/104.21 |
| 2018/0231326 A1 | 8/2018 | Rice | |
| 2019/0113288 A1* | 4/2019 | Cheng | F28D 15/0283 |
| 2019/0116698 A1* | 4/2019 | Lee | H05K 7/20336 |
| 2020/0149822 A1* | 5/2020 | Hsu | F28D 15/0266 |
| 2021/0084794 A1* | 3/2021 | Liu | H05K 7/20309 |
| 2021/0164736 A1* | 6/2021 | Lyon | H01L 23/473 |
| 2021/0247150 A1* | 8/2021 | Hsu | F28D 5/00 |
| 2022/0142001 A1* | 5/2022 | Pokharna | F28D 15/043 361/700 |

OTHER PUBLICATIONS

Ayel, V., et al. "Experimental Study of a Closed Loop Flat Plate Pulsating Heat Pipe Under a Varying Gravity Force," International Journal of Thermal Sciences, vol. 96, 2015, 25 pages.

International Search Report and Written Opinion for PCT Application No. PCT/US2021/058354, dated Mar. 16, 2022, 15 pages.

* cited by examiner

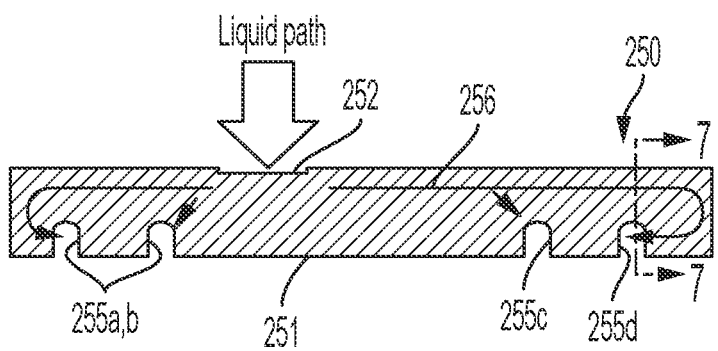
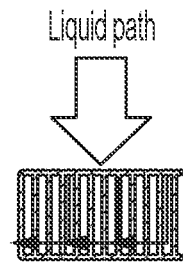
FIG. 6  FIG. 7
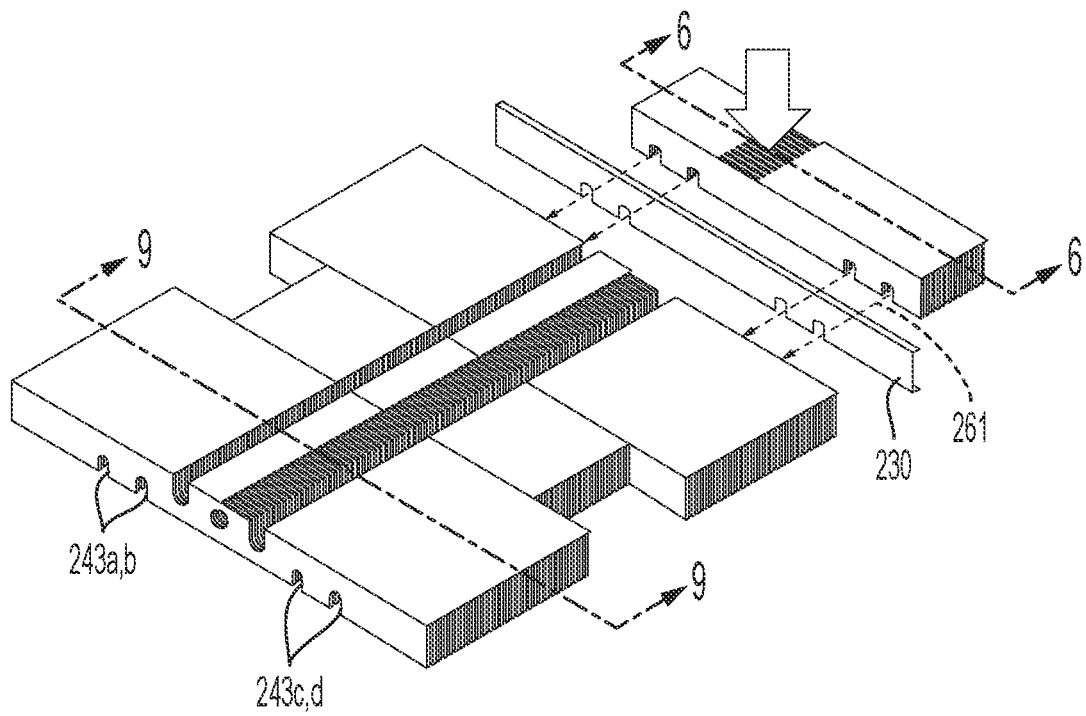
FIG. 8
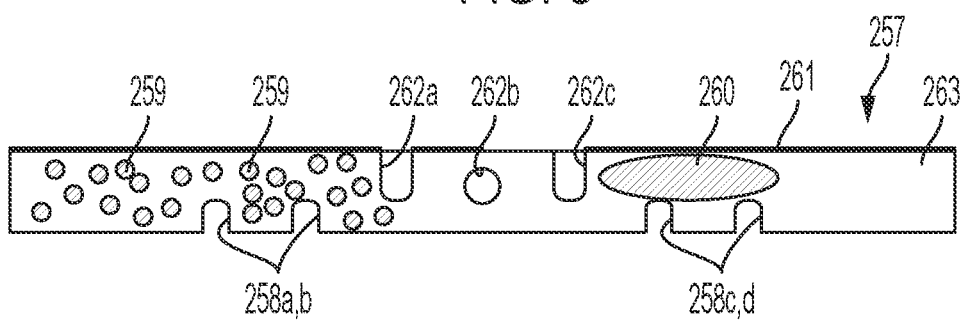
FIG. 9

LOOP THERMOSYPHON DEVICES AND SYSTEMS, AND RELATED METHODS

FIELD

This application and the subject matter disclosed herein (collectively referred to as the "disclosure"), generally concern devices and systems for facilitating heat transfer, and related methods. More particularly, but not exclusively, this disclosure pertains to loop thermosyphon devices and systems, and related methods, for cooling one or more heat-dissipating components, such as, for example, an electrical device.

BACKGROUND INFORMATION

Many industrial processes, consumer goods, power generators, combustion chambers, communication devices, electronic components, electrical storage components (e.g., batteries), etc., and associated systems, rely on heat transfer to function as intended. For example, some rely on cooling (e.g., radio transmitters) and others rely on heating (e.g., endo-thermic chemical reactions) to maintain a temperature within a specified range between an upper threshold temperature and a lower threshold temperature.

The prior art has responded to these challenges with a number of techniques for transferring heat from one medium to another. For example, conventional air cooling uses a fan or other air-mover to draw heat away from or to convey heat to another medium. Air cooling can be supplemented with an air-cooled heat sink, e.g., often a plate of thermally conductive material having surfaces, or fins, extending from the plate to provide a larger surface area available for transferring heat to or from the air flowing over the extended surfaces. Some heat-transfer systems use a liquid to transfer heat, as many liquids provide a relatively higher rate of heat transfer compared to gasses, e.g., air.

In still other systems, a heat-transfer fluid can change phase from liquid to gas (or vice-versa) to absorb (or to dissipate, respectively) relatively large amounts of energy over a narrow range of temperatures. Some prior phase-change systems include a pump to increase an operating pressure of the heat-transfer fluid to urge the heat-transfer fluid through a given circulation loop, as well as to manipulate the thermodynamic state of the heat-transfer fluid to achieve a desired heat-transfer performance from the fluid.

On the other hand, some prior heat-pipes and thermosyphons do not incorporate or rely on a mechanical pump to urge the heat-transfer fluid through a thermodynamic cycle. For example, as a heat-transfer fluid in the liquid phase absorbs heat in an evaporator region, the liquid phase transitions to a vapor phase. The vapor phase flows to a condenser region where the vapor phase rejects heat and condenses, returning to the liquid phase (or a saturated mixture of liquid and vapor). A heat-pipe typically includes a porous or other wick material that draws the liquid phase toward the relatively warmer evaporator region from the relatively cooler condenser region. By contrast, a thermosyphon typically relies on gravity to return the condensed liquid phase to the evaporator. A loop thermosyphon typically includes a vapor conduit that carries a vapor phase of the heat-transfer fluid from the evaporator region to the condenser region, and a liquid conduit that carries a liquid phase of the heat-transfer fluid from the condenser region to the evaporator region. Heat pipe systems have been the mainstay of thermal management for a long time. However, this incumbent technology is reaching its limits with devices that have very high power and power density.

SUMMARY

A loop thermosyphon can combine the best of heat-pipes and traditional liquid-cooling systems that include a mechanical pump. Like a heat pipe, a thermosyphon is passive, and like a pumped liquid loop, a loop thermosyphon can transport heat over a long distance due to an ultra-low thermal resistance provided by two-phase heat transfer. And, using a selected working fluid, even the small available height within a 1U server (e.g., about 1.75 inches) can provide sufficient flow within a disclosed loop thermosyphon to move 500 W of heat. An embodiment of a disclosed evaporator can achieve a low thermal resistance of 0.01° C.-cm$^2$/W with up to about 90 W/cm$^2$ of heat flux. A disclosed embodiment of a loop thermosyphon can passively cool about 1 kW of heat from an IP rated (e.g., a sealed) enclosure.

According to a first aspect, a disclosed heat-transfer device includes a first heat-transfer component and a second heat-transfer component fluidly coupled with each other by a first conduit and a second conduit. A first manifold is positioned in the first heat-transfer component and defines a first plurality of liquid pathways. The first manifold fluidly couples with the first conduit. A second manifold is also positioned in the first heat-transfer component and defines a second plurality of liquid pathways fluidly coupled with and extending from the first plurality of liquid pathways. The second manifold further defines a plurality of boiling channels, a plurality of accumulator channels and a vapor manifold. The boiling channels extend transversely relative to and are fluidly coupled with the second plurality of liquid pathways. The plurality of accumulator channels extends transversely relative to and are fluidly coupled with the plurality of boiling channels. The vapor manifold is configured to collect vapor from one or more of the plurality of boiling channels, one or more of the plurality of accumulator channels, or both. The first heat-transfer component further defines an outlet fluidly coupling the vapor manifold with the second conduit.

In an embodiment, the first heat-transfer component defines a fluid chamber and comprises a housing. The fluid chamber is positioned in the housing.

The first manifold can include a plurality of fins positioned in the fluid chamber. The plurality of fins, in turn, can define a proximal edge and a distal edge. The proximal edge of each fin can be thermally coupled with the housing and define a recess corresponding to each in the first plurality of liquid pathways.

Each in the first plurality of liquid pathways can extend transversely relative to the plurality of fins.

Adjacent ones of the plurality of fins can be spaced apart from each other, defining a corresponding plurality of fluid-distribution channels between adjacent fins and extending transversely relative to the first plurality of liquid pathways.

In an embodiment, each in the plurality of fluid-distribution channels between adjacent fins can have an enclosed region adjacent the distal edges of the fins and an open region adjacent the distal edges of the fins. The housing can define an inlet fluidly coupling the first fluid conduit with the open region of the fluid-distribution channels between adjacent fins.

The second manifold can include a plurality of fins positioned in the fluid chamber. The plurality of fins can define a proximal edge and a distal edge, the proximal edge of each fin being thermally coupled with the housing and defining a recess corresponding to each in the second plurality of liquid pathways.

Each in the second plurality of liquid pathways can extend transversely relative to the plurality of fins.

Adjacent ones of the plurality of fins can be spaced apart from each other, defining the plurality of boiling channels between adjacent fins.

Each of the plurality of fins can define a notch corresponding to each respective accumulator channel.

Each in the plurality of boiling channels between adjacent fins can have an enclosed region adjacent the distal edges of the fins and an open region adjacent the distal edges of the fins. Each open region can define an inlet to the vapor manifold.

The housing can define the outlet.

The outlet can extend across more than one of the open regions of the boiling channels.

The first conduit can include a first segment and a second segment. The first segment can extend from a proximal end fluidly coupled with the second heat-transfer component to a distal end having a first fluid coupler. The second segment can extend from a proximal end fluidly coupled with the first heat-transfer component to a distal end having a second fluid coupler. The first fluid coupler and the second fluid coupler can be so complementarily configured relative to each other as to be matingly engageable with each other to provide a fluid connection between the first segment and the second segment.

One or both of the first conduit and the second conduit can include a corresponding first segment configured to fluidly couple with and decouple from a corresponding second segment.

One or both of the first conduit and the second conduit can be configured to fluidly couple with and decouple from the first heat-transfer component, the second heat-transfer component, or both.

The second heat-transfer component can define a fluid chamber and include a housing. The fluid chamber can be positioned in the housing.

The second heat-transfer component can include a first condenser manifold and a second condenser manifold. The first condenser manifold can be positioned in the fluid chamber and define a vapor-distribution channel. The first condenser manifold can be fluidly coupled with the second conduit and further define a plurality of condensing channels and a first plurality of liquid-accumulation channels. The plurality of condensing channels can extend transversely relative to and be fluidly coupled with the vapor-distribution channel. The first plurality of liquid-accumulation channels can extend transversely relative to and be fluidly coupled with the plurality of condensing channels. The second condenser manifold can be positioned in the fluid chamber and define a second plurality of liquid-accumulation channels fluidly coupled with and extending from the first plurality of liquid-accumulation channels. The second condenser manifold can also define a liquid-outlet manifold and a plurality of liquid-conveyance channels configured to convey liquid from one or more of the second plurality of liquid-accumulation channels to the liquid-outlet manifold. The second heat-transfer component can also include an outlet fluidly coupling the liquid-outlet manifold with the first conduit.

A condenser housing can define a condenser chamber. The first condenser manifold can include a plurality of condenser fins positioned in the condenser chamber. The plurality of condenser fins can define a proximal edge and a distal edge, the proximal edge of each condenser fin being thermally coupled with the condenser housing and defining a recess corresponding to each in the first plurality of liquid-accumulation channels.

Each in the first plurality of liquid-accumulation channels can extend transversely relative to the plurality of condenser fins.

Adjacent ones of the plurality of condenser fins can be spaced apart from each other, defining a corresponding plurality of condensing channels between adjacent condenser fins and extending transversely relative to the vapor-distribution channel. Each in the plurality of condensing channels between adjacent condenser fins can have an enclosed region adjacent the distal edges of the condenser fins.

The plurality of condenser fins can be a first plurality of condenser fins and the second manifold can include a second plurality of condenser fins positioned in the condenser chamber. The second plurality of condenser fins can define a proximal edge and a distal edge, the proximal edge of each second condenser fin being thermally coupled with the housing and defining a recess corresponding to each in the second plurality of liquid-accumulation channels.

Each in the second plurality of liquid-accumulation channels can extend transversely relative to the second plurality of condenser fins.

Adjacent ones of the second plurality of condenser fins can be spaced apart from each other, defining the plurality of liquid-conveyance channels between adjacent fins.

The proximal edge of each second condenser fin can further define a recess corresponding to the liquid-outlet manifold.

Each in the plurality of condensing channels between adjacent second condenser fins can have an enclosed region adjacent the corresponding distal edges of the fins.

In another embodiment, the first heat-transfer component includes or is an evaporator and the second heat-transfer component includes or is a condenser.

The first conduit can include or be a liquid conduit and the second conduit can include or be a vapor conduit.

The condenser can include or be a fin-tube heat exchanger having a plurality of fins extending transversely from a plurality of tubes. The fin-tube heat exchanger can be configured to convey a working fluid through the tubes and to direct air over the fins, removing heat from the working fluid passing through the tubes.

A working fluid can be distributed throughout the first heat-transfer component, the second heat-transfer component, the first conduit and the second conduit.

In an embodiment, the working fluid is a saturated mixture of a liquid phase and a vapor phase.

According to another aspect, an electrical device includes an electrical component that dissipates heat while operating and an evaporator thermally coupled with the electrical component. The evaporator defines an inlet and an outlet and has a first manifold and a second manifold. The first manifold defines a first plurality of liquid pathways fluidly coupled with the inlet and the second manifold defines a second plurality of liquid pathways fluidly coupled with and extending from the first plurality of liquid pathways. The second manifold further defines a plurality of boiling channels and a plurality of accumulator channels, as well as a vapor-outlet manifold. The plurality of boiling channels extends transversely relative to and are fluidly coupled with the second plurality of liquid pathways. The plurality of accumulator channels extends transversely relative to and are fluidly coupled with the plurality of boiling channels.

The vapor-outlet manifold is fluidly coupled with the outlet and configured to collect vapor from one or more of the plurality of boiling channels, one or more of the plurality of accumulator channels, or both.

The evaporator can define a fluid chamber and include a housing. The fluid chamber can be positioned in the housing.

The first manifold can include a plurality of fins positioned in the fluid chamber. The plurality of fins can define a proximal edge and a distal edge. The proximal edge of each fin can be thermally coupled with the housing and define a recess corresponding to each in the first plurality of liquid pathways.

Each in the first plurality of liquid pathways can extend transversely relative to the plurality of fins.

Adjacent ones of the plurality of fins can be spaced apart from each other, defining a corresponding plurality of fluid-distribution channels between adjacent fins. The plurality of fluid-distribution channels can extend transversely relative to the first liquid pathways.

Each in the plurality of fluid-distribution channels between adjacent fins can have an enclosed region adjacent the distal edges of the fins and an open region adjacent the distal edges of the fins. The housing can define an inlet fluidly coupling the first fluid conduit with the open region of the fluid-distribution channels between adjacent fins.

The second manifold can include a plurality of fins positioned in the fluid chamber. The plurality of fins can define a proximal edge and a distal edge, with the proximal edge of each fin being thermally coupled with the housing and defining a recess corresponding to each in the second plurality of liquid pathways. Each in the second plurality of liquid pathways can extend transversely relative to the plurality of fins.

Adjacent ones of the plurality of fins can be spaced apart from each other, defining the plurality of boiling channels between adjacent fins. Each of the plurality of fins can define a notch corresponding to each respective accumulator channel.

Each in the plurality of boiling channels between adjacent fins can have an enclosed region adjacent the distal edges of the fins and an open region adjacent the distal edges of the fins. Each open region can define an inlet to the vapor-outlet manifold.

The housing can define the outlet. The outlet can extend across more than one of the open regions of the boiling channels.

In an embodiment, the electrical device also includes a first fluid coupler and a first conduit extending from a proximal end fluidly coupled with the inlet to the evaporator to a distal end fluidly coupled with the first fluid coupler. The electrical device can also include a second fluid coupler and a second conduit extending from a proximal end fluidly coupled with the outlet from the evaporator to a distal end fluidly coupled with the second fluid coupler.

The electrical device can include a housing defining an outer boundary of the electrical device. The first fluid coupler, the second fluid coupler, or both, can extend across the outer boundary, providing a corresponding external fluid connection with the evaporator.

The housing can define a sealed enclosure separating the electrical component from an environment external of the housing.

The electrical device can also include a condenser having an inlet and an outlet. The inlet to the condenser can be fluidly coupled with the second fluid coupler and the outlet from the condenser can be fluidly coupled with the first fluid coupler.

The electrical device can also include a condenser having an inlet and an outlet. The inlet to the condenser can be fluidly coupled with the second fluid coupler and the outlet from the condenser can be fluidly coupled with the first fluid coupler.

The first conduit, the second conduit, or both, can have a corresponding first segment and a corresponding second segment. Each respective first segment and second segment can be fluidly couplable with and decouplable from each other. For example, each second segment can be fluidly coupled with the condenser and each first segment can be fluidly coupled with the evaporator.

The electrical device can also include a housing. The electrical component and the evaporator can be positioned within the housing. The condenser can be positioned externally of the housing.

In an embodiment, the condenser has an inlet and an outlet. The electrical device can also include a first conduit fluidly coupling the outlet from the condenser with the inlet to the evaporator, as well as a second conduit fluidly coupling the outlet from the evaporator with the inlet to the condenser.

The condenser can be spaced apart from the housing.

In an embodiment, the electrical device also includes a working fluid distributed throughout the evaporator. For example, the working fluid can include a saturated mixture of a liquid phase and a vapor phase.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

FIG. 6 shows a cross-sectional, side-elevation view of a liquid distribution manifold in FIG. 5.

FIG. 7 shows a cross-sectional, end-elevation view of the liquid distribution manifold in FIG. 5.

FIG. 8 shows an annotated version of FIG. 5 illustrating a flow of a working fluid through regions of the manifold structures.

FIG. 9 shows a cross-sectional, side-elevation view of the vaporization manifold in FIG. 5.

DETAILED DESCRIPTION

The following describes various principles related to loop thermosyphons. For example, certain aspects of disclosed principles pertain to evaporator features and certain other aspects pertain to features of conduits coupling an evaporator with a condenser. And still other aspects pertain to systems that such loop thermosyphons. That said, descriptions herein of specific apparatus configurations and combinations of method acts are but particular examples of contemplated features chosen as being convenient illustrative examples of disclosed principles. One or more of the disclosed principles can be incorporated in various other components and systems to achieve any of a variety of corresponding functional characteristics.

Thus, components and systems having attributes that are different from those specific examples discussed herein can embody one or more presently disclosed principles, and can be used in applications not described herein in detail. Accordingly, such alternative embodiments also fall within the scope of this disclosure.

I. OVERVIEW

Some concepts disclosed herein generally concern loop thermosyphon devices and systems, and associated methods. Some disclosed concepts pertain to systems, methods, and components to facilitate cooling of heat-dissipating components with such a loop thermosyphon. In some respects, a disclosed embodiment of loop thermosyphon is a closed, hermetically sealed system, as in FIG. 1, partially filled with a working fluid having little or no non-condensable gas. As but one example, a disclosed loop thermosyphon system can be configured to passively cool up to 1 kW dissipated by one or more electrical components within a sealed enclosure using a passively driven, self-sustained fluid motion.

Figure 1:
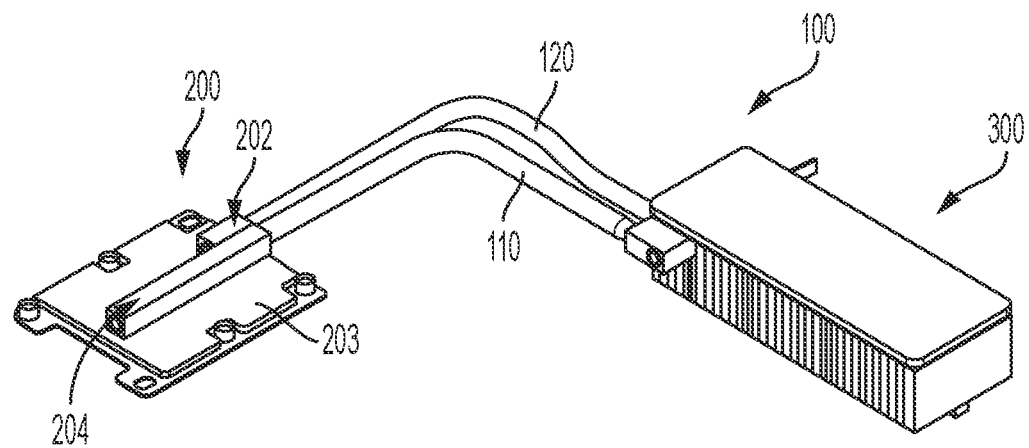
FIG. 1 illustrates an isometric view of a loop thermosyphon.
Figure 2:
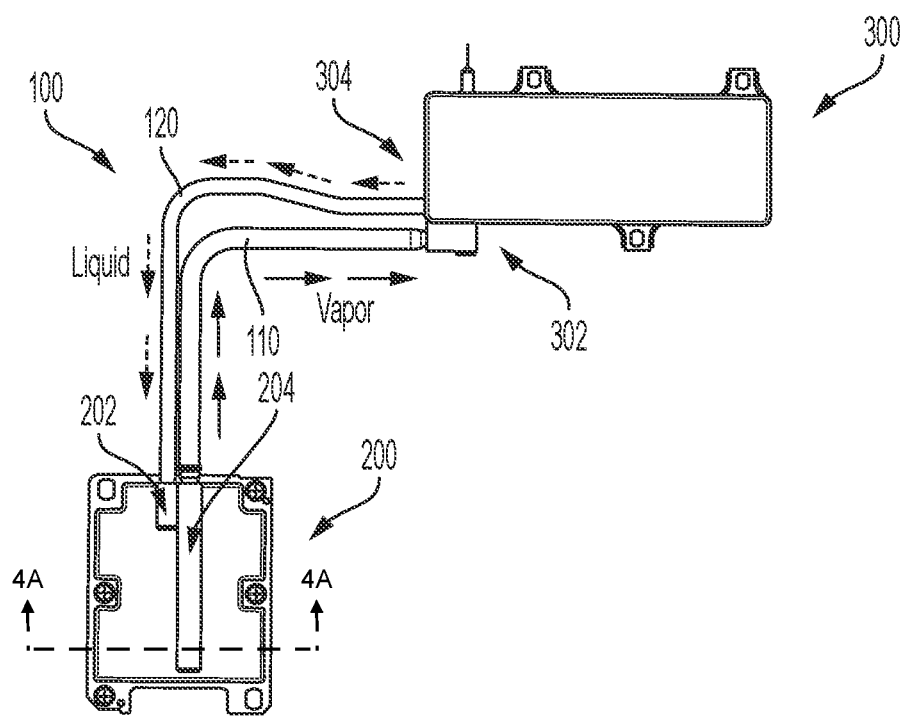
FIG. 2 illustrates a side elevation view of the loop thermosyphon shown in FIG. 1.

FIGS. 1 and 2, by way of example, illustrate aspects of such a loop thermosyphon. The illustrated loop thermosyphon 100 includes an evaporator 200 and a condenser 300 coupled with each other by a vapor (evaporator-to-condenser) conduit 110 and a liquid (condenser-to-evaporator) conduit 120. The evaporator 200 can be thermally coupled with one or more electrical components, for example, that dissipate heat during operation. The evaporator can transfer heat absorbed from the electrical components to a working fluid passing through the evaporator. The self-sustained fluid motion can carry the working fluid through the conduit 110 to the condenser 300, where the absorbed heat is rejected to another medium (e.g., atmosphere or a facility-supplied liquid). The working fluid, cooled by the condenser, can return to the evaporator 200 through the second conduit 120.

The self-sustained fluid motion of a loop thermosyphon results from a density gradient within the working fluid that arises from simultaneous evaporation in an evaporator region and condensation in a condenser region. Disclosed loop thermosyphons provide a vapor-phase flow path separate from a liquid-phase flow path, accentuating the self-sustained fluid motion. Heat is supplied at a lower elevation of the thermosyphon device (in the evaporator), where the working fluid, sometimes also referred to in the art as a "refrigerant," changes phase from a liquid phase to a vapor phase, or a saturated mixture of the liquid phase and the vapor phase. The liquid-vapor mixture, being less dense than the liquid phase, rises through a two-phase adiabatic section (e.g., conduit 110) until the mixture reaches the condenser (positioned at a relatively higher elevation, relative to gravity, than the evaporator). At the condenser, the latent heat contained in the liquid-vapor mixture is released, condensing the refrigerant to the liquid phase. The condensed liquid phase returns through a second adiabatic section to the evaporator, where evaporation again occurs, driving the passive, gravity-driven flow-motion.

Each respective conduit 110, 120 is substantially adiabatic, e.g., provides little if any transfer of heat to or from the working fluid passing through the respective conduit, particularly compared to the amount of heat transferred to the working fluid in the evaporator 200 and from the working fluid in the condenser 300.

In FIGS. 1 and 2, the evaporator 200 is configured to receive a liquid-phase of a working fluid from the liquid conduit 120 through an inlet 202 and to exhaust a vapor-phase of working fluid to the vapor conduit 110 through an outlet 204. As explained more fully below and shown schematically in FIG. 3, the evaporator 200 is configured to distribute the liquid-phase among a plurality of boiler channels 214 and to accumulate a vapor-phase of the working fluid from among the boiler channels in one or more vapor accumulators 215. And, the evaporator 200 is configured to convey the accumulated vapor-phase from the vapor accumulator 215 through a manifold 216. Referring again to FIGS. 1 and 2, the vapor phase passes from the vapor manifold 216 (FIG. 3) through the outlet 204 and into to the vapor conduit 110, which in turn conveys the vapor-phase to the condenser 300.

As the working fluid passes through the condenser 300, rejecting heat to another medium (not shown), the working fluid condenses to the liquid phase. The condensed working fluid passes from the condenser 300 into the liquid conduit 120 and returns to the evaporator 200. As FIGS. 1 and 2 show, the condenser 300 can be positioned remotely from the evaporator 200, similar to a more conventional pumped liquid cooling loop, providing design flexibility and reliable heat-transfer in many applications.

In some embodiments, the liquid conduit 120, the vapor conduit 110, or both, has two or more corresponding segments that can be coupled with and decoupled from each other. A loop thermosyphon that incorporates such a segmented conduit can provide further design and installation flexibility. For example, a segmented liquid-conduit, vapor-conduit, or both, for example, can permit a loop thermosyphon to be installed in a piecewise fashion, with the separate components being assembled at or near a point of use. Often, individual components are lighter and easier to maneuver as compared to a fully assembled loop thermosyphon, making a piecewise installation easier and more convenient than installation of a fully assembled loop thermosyphon.

Additionally, some embodiments of disclosed loop thermosyphons can be charged with a working fluid at a point of use during installation rather than at a factory during manufacturing. This can allow an end user to select from among different working fluids and can also make shipping less costly and installation relatively easier (even if a fully assembled thermosyphon is installed), as the installation technicians will not need to contend with the weight of the working fluid concurrently with maneuvering the loop thermosyphon into place.

Section II below describes principles pertaining to evaporators suitable for a loop thermosyphon and Section III describes principles pertaining to condensers. Sections IV and V, below, describe principles relating to conduits (including segmented conduits) and working fluids, respectively. Section IV describes aspects of certain system examples and Section VII describes aspects of certain other embodiments. Other, related principles also are disclosed throughout this disclosure.

II. EVAPORATORS

Turning now to FIGS. 3 through 9, aspects of a disclosed evaporator are described.

Figure 3:
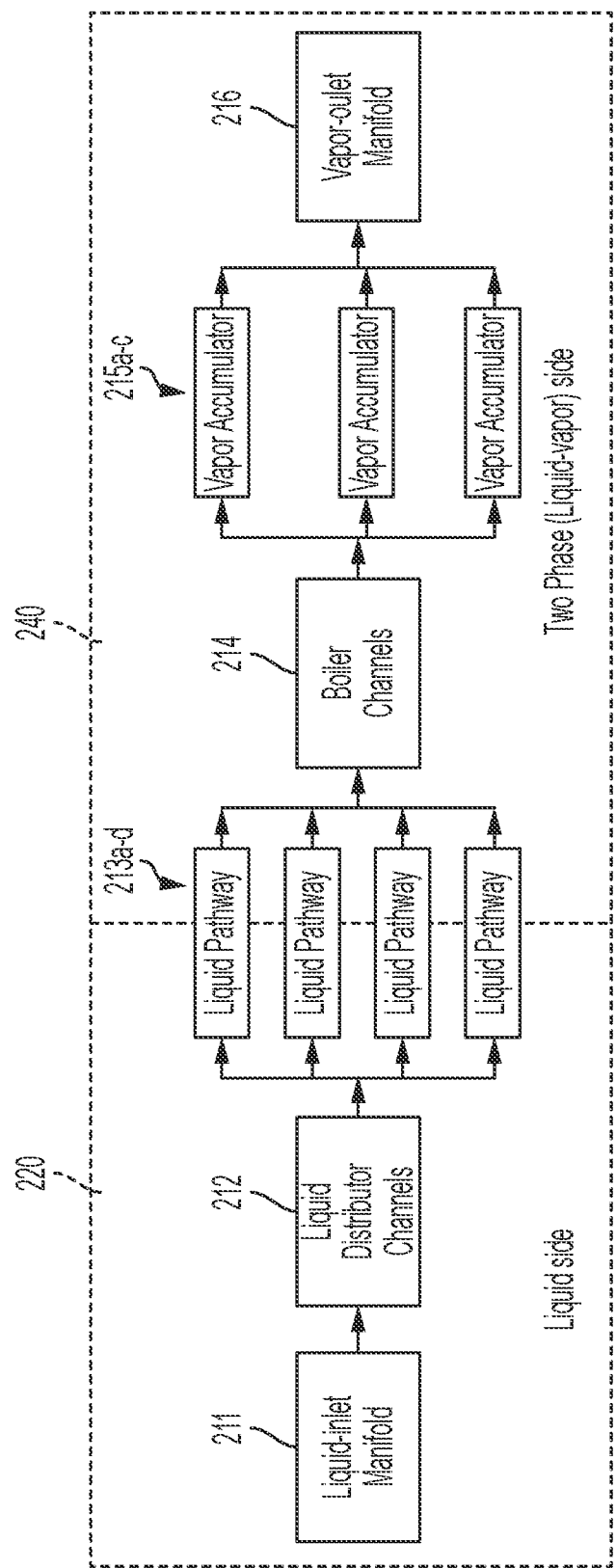
FIG. 3 schematically illustrates an architecture of an evaporator portion of a loop thermosyphon as in FIG. 1.

As FIG. 3 shows, after passing through the inlet 202 (FIGS. 1 and 2), a liquid phase of the working fluid enters a liquid-inlet manifold 211 that distributes the liquid phase among a plurality of liquid distributor channels 212. Each of the liquid distributor channels, in turn, conveys the working fluid (still predominantly or entirely in the liquid phase) to one or more liquid pathways 213a, 213b, 213c, 213d, which in turn convey the working fluid to a plurality of boiler channels 214. (Although four liquid pathways are indicated in the drawings, disclosed evaporators may have more or fewer such liquid pathways.) As explained more fully below, the working fluid, although perhaps heated to some degree while passing from the inlet 202 to the liquid pathways, absorbs substantial energy passing through the boiler channels 214. As the working fluid absorbs energy as latent heat in the boiler channels, it boils (e.g., vaporizes). The evaporator 200 has one or more vapor accumulators 215a, 215b, 215c that collect the vapor phase from the boiler channels. Accumulating the vapor phase in this manner can allow the working fluid to continue to flow through and absorb heat in the boiler channels without entering a so-called "dry-out" or "vapor-lock" condition within the boiler channels. The accumulated vapor enters a vapor-outlet manifold 216 from which the vapor exhausts through the vapor outlet 204 (FIGS. 1 and 2).

Figure 4:
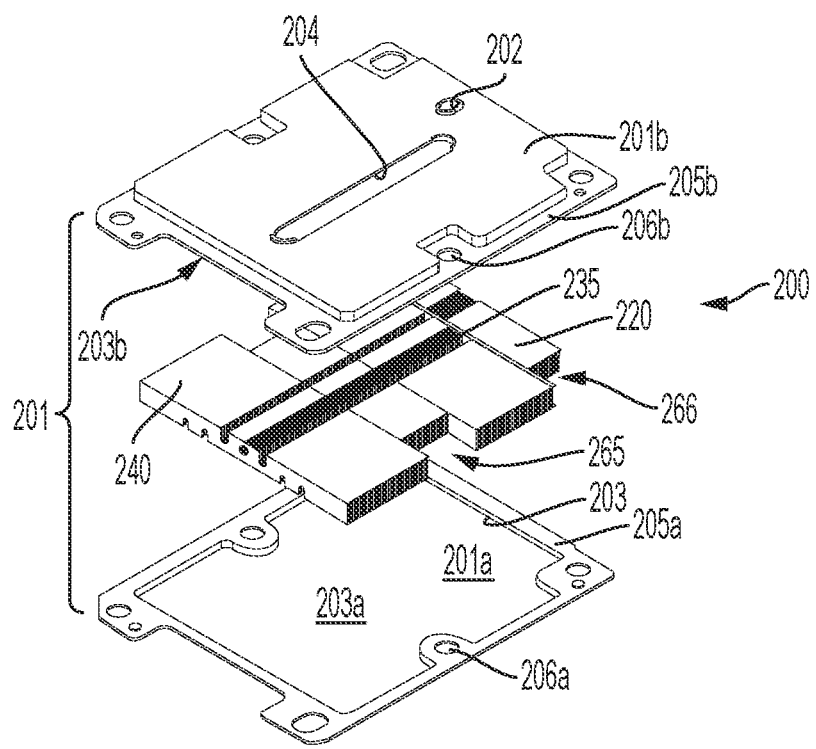
FIG. 4 shows an isometric, exploded view of the evaporator component of the loop thermosyphon in FIG. 1.

FIGS. 4 through 9 show an embodiment of an evaporator as depicted schematically in FIG. 3. In FIG. 4, the evaporator 200 has a housing 201 that defines a chamber 203 between a base 201a and a lid 201b. The base 201a, the lid 201b, or both, can be stamped from, e.g., a sheet of aluminum, or otherwise manufactured from a thermally conductive material. As shown in FIG. 4, one or both of the base 201a and the lid 201b can define a corresponding recessed region 203a, 203b surrounded by a corresponding peripheral flange 205a, 205b. The opposed recesses 203a, 203b have a complementary arrangement relative to each other so as to define the chamber 203 as the opposed peripheral flanges 205a, 205b are brought into a mating registration with each other as shown, for example, in the isometric view shown in FIG. 1. The flanges 205a, 205b also define complementary features (e.g., apertures through which corresponding fasteners can extend) suited to secure the flanges together. For example, in FIG. 4, the flanges 205a, 205b define a plurality of through-hole apertures 206a, 206b through which a fastener (e.g., a bolt) can extend, allowing the flanges to be urged toward each other in a sealing relationship. And, an O-ring or other gasket (not shown), or a curable sealant, can be positioned between the peripheral flanges 205a, 205b to further inhibit or altogether prevent leakage of working fluid from (or air or other non-condensable gas into) the chamber 203.

Figure 5:
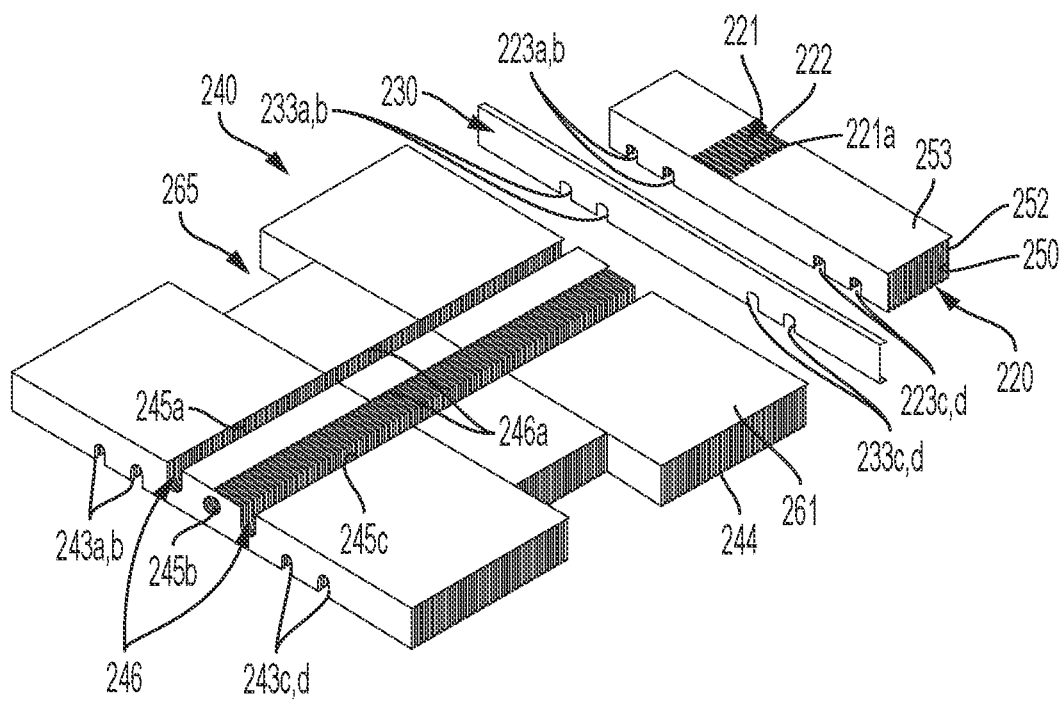
FIG. 5 shows an isometric, exploded view of the manifold structures in the evaporator shown in FIG. 4.

Within the chamber 203, the evaporator 200 has a first manifold member 220 and a second manifold member 240 (also shown schematically in FIG. 3) separated from each other by one or more separators 230. The first manifold member 220 is configured to distribute the liquid-phase that entered the chamber 203 through the liquid inlet 202 from the liquid conduit 120 (FIGS. 1 and 3) among a plurality of liquid pathways 213a-d (FIG. 3). In FIG. 5, the liquid pathways 223a-d are analogous to the liquid pathways 213a-d shown in FIG. 3. The second manifold member, in turn, is configured to (1) distribute the working fluid among a plurality of boiler channels 214 from the plurality of liquid pathways; (2) transfer heat to the working fluid, causing it to boil in the boiler channels 214; and (3) collect the vapor phase from among the boiler channels to allow it to exhaust through the vapor outlet 204.

More particularly, in the embodiment shown in FIGS. 4-9, the first manifold member 220 defines a liquid-inlet manifold 221. The inlet manifold 221 receives the liquid phase from the liquid inlet 202 and distributes the liquid among a first plurality of fluid-distribution channels 222. For example, as shown in FIG. 5, the fluid-distribution channels 222 can be defined between a corresponding plurality of spaced-apart fins 250. Each of the fins 250 can have a proximal edge 251 (FIG. 6) positioned adjacent and thermally coupled with the base 201a of the housing 201 and distal edge 252 (FIG. 6) positioned adjacent and thermally coupled with the lid 201b. For example, the fins 250 can be defined by a corrugated sheet of thermally conductive material, such that every other corrugation adjacent the proximal edges of the fins can be thermally coupled with the base 201a and the intervening corrugations 253 positioned adjacent the distal edges of the fins can be thermally coupled with the lid 201b.

A brazing or other joining technique (e.g., controlled area brazing, soldering) can provide such thermal coupling. Of course, such folded fins are just an example; many manufacturing techniques are available for providing spaced-apart fins that define the fluid-distribution channels and any of them may be suitable for manufacturing the first manifold member 220. For example, an array of plate fins can extend from a base member (not shown) adjacent the proximal fin edges to a cap member adjacent the distal fin edges, enclosing the liquid distributor channels. In still other embodiments, the fins 250 are continuous with the base 201a or the lid 201b (or both).

As FIGS. 4 and 5 show, a region 221a of the upper corrugations 253 of the first manifold member 220 can be removed to expose the liquid distributor channels 222 to the flow of working fluid received through the liquid inlet 202. For example, the region 221a can be generally aligned with the liquid inlet 202, defining a liquid-inlet manifold 221 configured to distribute incoming liquid among the liquid distributor channels 222. The liquid distributor channels 222, in turn, can convey the working fluid laterally outward (depicted by arrows 256 in FIG. 6) of the liquid-inlet manifold 221 to each of a plurality of liquid pathways 223a, 223b, 223c, 223d. The liquid pathways 223a, 223b, 223c, 223d can be oriented transversely relative to the liquid distributor channels 222 and the fins 222a so as to convey the working fluid from the first manifold member 220 toward the second manifold member 240.

As also shown in FIGS. 4 and 5, the plurality of liquid pathways 223a, 223b, 223c, 223d can be a first plurality of liquid pathways. The second manifold member 240, in turn, can define a second plurality of corresponding liquid pathways 243a, 243b, 243c, 243d. Each of the illustrated second plurality of liquid pathways 243a, 243b, 243c, 243d is fluidly coupled with and extends from a corresponding one of the first plurality of liquid pathways 223a, 223b, 223c, 223d (e.g., second pathway 243a extends from first pathway 223a, etc.). Stated differently, each in the second plurality of liquid pathways 243a-d can receive the working fluid (e.g., liquid, vapor, or a mixture of liquid and vapor) from a corresponding one or more of the first plurality of liquid pathways 223a-d.

By way of example, as shown in FIG. 6, the proximal edge 251 of each fin 250 in the first manifold member 220 can define a recess 255a-d corresponding to each in the plurality of liquid pathways 223a, 223b, 223c, 223d. The recesses 255a-d defined by adjacent fins 250 can be in alignment with each other, allowing the working fluid (depicted by the arrow 256) flowing between the fins 255 in the liquid distributor channels 222 to enter the liquid pathways 223a-d and to flow transversely relative to the fins 250 along the liquid pathways 223a, 223b, 223c, 223d, e.g., through the aligned recesses 255a-d of each fin as generally depicted in FIG. 7.

Referring again to FIGS. 4 and 5, similar to the first manifold member 220, the second manifold member 240 can have a plurality of spaced-apart fins 257. Like the fins 250 of the first manifold member 220 shown in FIG. 6, the fins 257 of the second manifold member 240 can have a proximal edge positioned adjacent and thermally coupled with the base 201a of the housing 201 and distal edge 252 positioned adjacent and thermally coupled with the lid 201b. The fins 257 can be manufactured and/or assembled with the housing 201 of the evaporator 200 in a manner as described above in connection with the fins of the first manifold member 220.

Further, as shown in FIGS. 8 and 9, the proximal edge of each fin 257 in the second manifold member 240 can define a recess 258a-d corresponding to each in the plurality of liquid pathways 243a, 243b, 243c, 243d. The recesses 258a-d defined by adjacent fins 257 can be in alignment with each other, allowing the working fluid received from the first manifold member 220 (e.g., depicted in arrows 261 in FIG. 8) to penetrate into the second manifold member 240 transversely relative to the fins 257.

Note that the illustrated embodiment shown in FIGS. 4-9 has a one-to-one correspondence between the number of liquid pathways in the first plurality (e.g., the first manifold member 220) and the number of liquid pathways in the second plurality (e.g., the second manifold member 240). However, in other embodiments, the first plurality of liquid pathways may have more or fewer than the number liquid pathways in the second plurality. That being said, each in the second plurality of liquid pathways receives the working fluid from one or more corresponding liquid pathways in the first plurality, and each in the first plurality of liquid pathways delivers the working fluid to one or more corresponding pathways in the second plurality.

Also shown in FIGS. 4, 5 and 8 is a separator 230 positioned between the first manifold member 220 and the second manifold member 240. The separator 230 defines one or more liquid pathways 233a-d coupling the liquid pathways 223a-d defined by the first manifold member 220 with the liquid pathways 243a-d defined by the second manifold member 240. Although the illustrated separator defines a number of liquid pathways 233a-d in one-to-one correspondence with the number of liquid pathways 223a-d defined by the first manifold member 220 and liquid pathways 243a-d defined by the second manifold member 240, in other embodiments, the separator 230 can be configured as an intervening manifold structure configured to distribute working fluid from one of the liquid pathways defined by the first manifold member 220 among a plurality of the liquid passageways defined by the second manifold member. Conversely, the separator 230 can be configured as an intervening manifold structure configured to accumulate working fluid from among the plurality of liquid passageways defined by the first manifold member 220 and to convey the accumulated working fluid to a lesser number of a liquid passageways defined by the second manifold member 240.

In the embodiment shown in FIGS. 4, 5 and 8, the separator 230 comprises one or more fins, each defining a plurality of recesses from the proximal edge corresponding to the plurality of liquid pathways defined by the first manifold member 220 and the second manifold member 240. However, when the number of liquid pathways defined by the first manifold member 220 differs from the number of liquid pathways defined by the second manifold member 240, the separator fin(s) positioned adjacent the first manifold member can define a number of recesses corresponding to the number of liquid pathways defined by the first manifold member. Similarly, the separator fin(s) positioned adjacent the second manifold member can define a number of recesses corresponding to the number of liquid pathways defined by the second manifold member, allowing the working fluid to flow in a direction transverse to the fins of the separator, distributing or accumulating working fluid within the separator before flowing into the second manifold member.

Referring still to FIGS. 4, 5 and 8, the second manifold member 240 also defines a plurality of boiling channels 244 extending transversely relative to and fluidly coupled with the second plurality of liquid pathways 243a-d. For example, as noted above, the second manifold member 240 can have a plurality of spaced-apart fins 257 defining the boiling channels 244 between adjacent ones of the fins. As the working fluid flows through the second plurality of liquid pathways 243a-d defined by the second manifold member 240 and across the fins 257, the working fluid can flow into the boiling channels 244. While passing through the boiling channels, the working fluid can absorb heat through the base 201a of the housing and the fins 257, causing the working fluid to boil within the boiling channels 244. In FIG. 9, the resulting vapor phase is depicted by the circles 259 and oval 260 (e.g., representing bubbles of vapor phase within the liquid phase).

The illustrated embodiment of the second manifold member 240 defines a plurality of vapor accumulators 245a, 245b, 245c, similar in function to the one or more vapor accumulators 215a, 215b, 215c described above. Similar in construction to the liquid pathways 243a-d, described above, each vapor accumulator 245a, 245c can be defined by recesses defined by the fins 257. For example, as shown in FIG. 9, each fin 257 (or a subset of them) can define a recess 262a, 262c from a distal edge 263 (e.g., opposite the edge that defines the recesses 258a-d), and the respective recesses 262a, 262c defined by the plurality of fins 257 of the second manifold member 240 can be aligned with each other, defining corresponding channels (i.e., the vapor accumulators 245a, 245c) extending across the fins 257. As well, or alternatively, each fin 257 (or a subset of them) can define an aperture, or notch, 262b. The apertures (or notches) 262b can be aligned with each other, defining a vapor accumulator 245b extending through the fins 257. As noted above, accumulating the vapor phase in this manner can allow the working fluid to continue to flow through and absorb heat in the boiler channels 244 without entering a so-called "dry-out" or "vapor-lock" condition within the boiler channels. Dry-out or vapor lock conditions reduce the effectiveness of the evaporator to absorb heat because the flow of liquid-phase through the vapor-locked channels 244 ceases, preventing the working fluid from absorbing latent heat and further boiling.

As with the first manifold member 220, the second manifold member 240 can define an upper and/or a lower cap 261 (e.g., as provided by corrugations similar to the corrugations 253 described above) enclosing the boiling channels 244. As well, such a cap can provide an interface region for thermally coupling the second manifold member 240 with the base 201*a* or lid 201*b* in a manner as described above in connection with the corrugations 253.

And, similar to the first manifold member 220, the second manifold member can have a region 246*a* of the cap removed, defining a vapor-outlet manifold 246. Accumulated vapor phase enters the vapor-outlet manifold 246 from which the vapor exhausts through the vapor outlet 204 (FIGS. 1 and 2). The outlet 204 defined by the housing 201 can be aligned with the vapor-outlet manifold 246, fluidly coupling the vapor conduit 110 (FIGS. 1 and 2) with the vapor-outlet manifold 246 defined by the second manifold member 240. For example, each boiling channel 244 can have a corresponding region of the cap 261 removed, exposing the boiling channel and defining a vapor outlet therefrom. Taken together, the vapor outlet from each boiling channel 244 defines an inlet to the vapor-outlet manifold 246. The vapor outlet 204 defined by the housing 201 can extend across more than one of the open regions of the boiling channels 244.

In FIG. 8, the vapor-outlet manifold 246 is defined by a recess or notch 262*a*, 262*b* (FIG. 9) from a distal edge of the fins defining the boiling channels 244. (In this context, the "distal edge" refers to the edge of the fins that are spaced apart from the base 201*a* of the evaporator 201. By contrast, a "proximal edge" of the fins is in thermal contact with or formed continuously from the interior surface 203*a* of the base 201*a*.) The vapor-outlet manifold 246, which spans across the boiling channels 244, releases pressure from the boiling channels 244 that arises in the boiling process. Stated differently, the vapor-outlet manifold 246 acts as an accumulator, e.g., region with a relatively a large volume (compared to the volume of a given boiling channel) which can collect a primarily vapor-phase of the working fluid. Alternatively, a notch or through-hole in each fin can be aligned with adjacent notches or through-holes to define an accumulator 245*b*. The accumulators 245*b* and 246 can be spaced from the base 201*a* of the evaporator to allow more fin material closer to the base 201*a* to enhance heat transfer (e.g., to maintain high fin-efficiency).

As shown by way of example in FIG. 4, the second manifold member 240 can define a laterally recessed region 265. The laterally recessed region corresponds to a contour of the peripheral flanges 205*a*, 205*b* defined by the housing 201. Similarly, the first manifold member 220 defines a recessed region 266 corresponding to an inward projection of the peripheral wall. Unlike the embodiment shown in FIG. 4, some embodiments of an evaporator do not have bends or other inward protrusions defined by the peripheral wall of the chamber 203 enclosing the manifold members 220, 240, and thus do not have a corresponding recessed region 265. In other embodiments, the peripheral wall defines an inward protrusion extending transverse relative to the fins 257 rather than longitudinally of them as in FIG. 4. In those embodiments, some fins 257 (or the fins 252 of the first manifold member) may be interrupted, providing shorter boiling channels (or liquid-distributor channels).

As noted above, an electrical component 501 can be thermally coupled with an external surface of the base 201*a* of the evaporator housing 201 (FIG. 4). In some applications, a major surface of the electrical component 501 can be substantially smaller than the external major surface of the base 201*a* that is in thermal contact with the electrical component. And, in some evaporator embodiments, the base 201*a* is formed from a relatively thin, conductive metal, e.g., aluminum (or other material compatible with a suitable working fluid). Although a thin, conductive base 201*a* can facilitate conductive heat transfer transversely through the base 201*a*, a substantial difference between the area of the electrical component 501 and the area of the base 201 can introduce a non-negligible thermal-spreading-resistance. Such a thermal-spreading-resistance can limit some embodiments' overall thermal resistance. Stated differently, even if the thermosyphon's overall thermal resistance is very low, the thermal resistance from the chip to the ultimate heat sink may be dominated by the spreading resistance.

Some disclosed evaporators incorporate an augmented thermal contact for spreading heat from a concentrated area (e.g., a region of high heat flux, such as, for example, a small electrical component) to a larger area (e.g., a major surface of the base 201*a*). Other embodiments incorporate an augmented thermal contact for spreading heat from a region positioned off-center of the evaporator to the rest of the evaporator. For example, some system designs may make it preferable to position a component-to-be-cooled off-center relative to the evaporator 201. With such an embodiment, an evaporator base 201 having an augmented thermal contact can efficiently spread the heat from the component to the remainder of the evaporator.

Figure 4A:
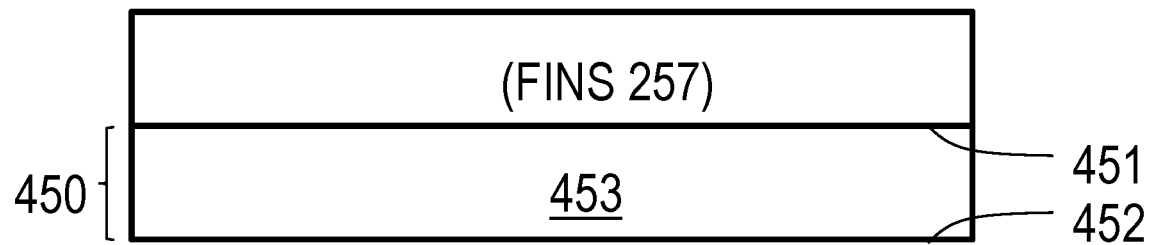
FIG. 4A and FIG. 4B schematically illustrate an evaporator with a respective embodiment of an augmented thermal contact.

In one embodiment, the augmented thermal contact can simply be a layer of material that exhibits significantly higher thermal conductivity than the material (e.g., aluminum or copper) from which the evaporator base 201*a* is made. For example, if the evaporator base is made of aluminum (which is compatible with some refrigerants), copper cladding on the major surface of the base 201*a* can form the augmented thermal contact. Of course, other materials that exhibit high thermal conductivity also can be used in combination with an aluminum evaporator base (e.g., diamond, carbon nanotubes, etc.). In some embodiments, a material that provides non-homogeneous thermal conductivity can form an augmented thermal contact. For example, some materials (e.g., carbon nanotubes) can exhibit high in-plane thermal conductivity with lower through-plane conductivity. Such materials can still be useful if the lateral thermal conductivity is sufficiently high as to conduct heat laterally and if the material is thin enough that the through-plane thermal resistance remains relatively low. Another augmented thermal contact embodiment is an oscillating heat pipe (OHP). For example, an OHP can be soldered to the base 201*a* of the evaporator. In another embodiment, the base 201*a* of the evaporator forms a common wall with an OHP 450 (FIG. 4A).

Figure 4B:
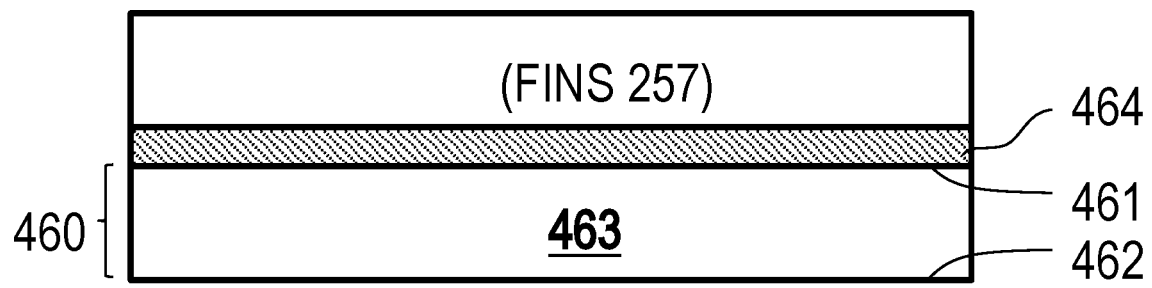

For example, referring again to FIG. 4A, the major surface 451 of the base 201*a* positioned opposite the recessed region 203*a* can form an internal surface of an OHP 450. That is to say, another sheet of material 452, similar to the base 201*a*, can attach to the underside of the base 201*a* of the evaporator, defining an internal gap or chamber 453 between the base 201*a* and the other sheet of material. The internal gap or chamber 453, which may include a wick structure (not shown), can define the volume through which the working fluid of the OHP 450 transits. Moreover, an evaporator 201 with such a stratified base as in FIG. 4A can enjoy a low spreading resistance provided by the OHP 450 and eliminate a through-plane resistance of solder 464 or other material that would otherwise be present at the interface between the base 201a and a stand-alone OHP 460 that is affixed to the underside of the base 201a as in FIG. 4B. In FIG. 4B and in contrast to the embodiment in FIG. 4A, the upper wall 461 is a distinct component from the base 201a. In FIG. 4B, a lower wall 462 is positioned opposite the upper wall 461 relative to the internal gap or chamber 463, which may include a wick structure (not shown) and can define the volume through which the working fluid of the OHP 460 transits.

III. CONDENSERS

Figure 10:
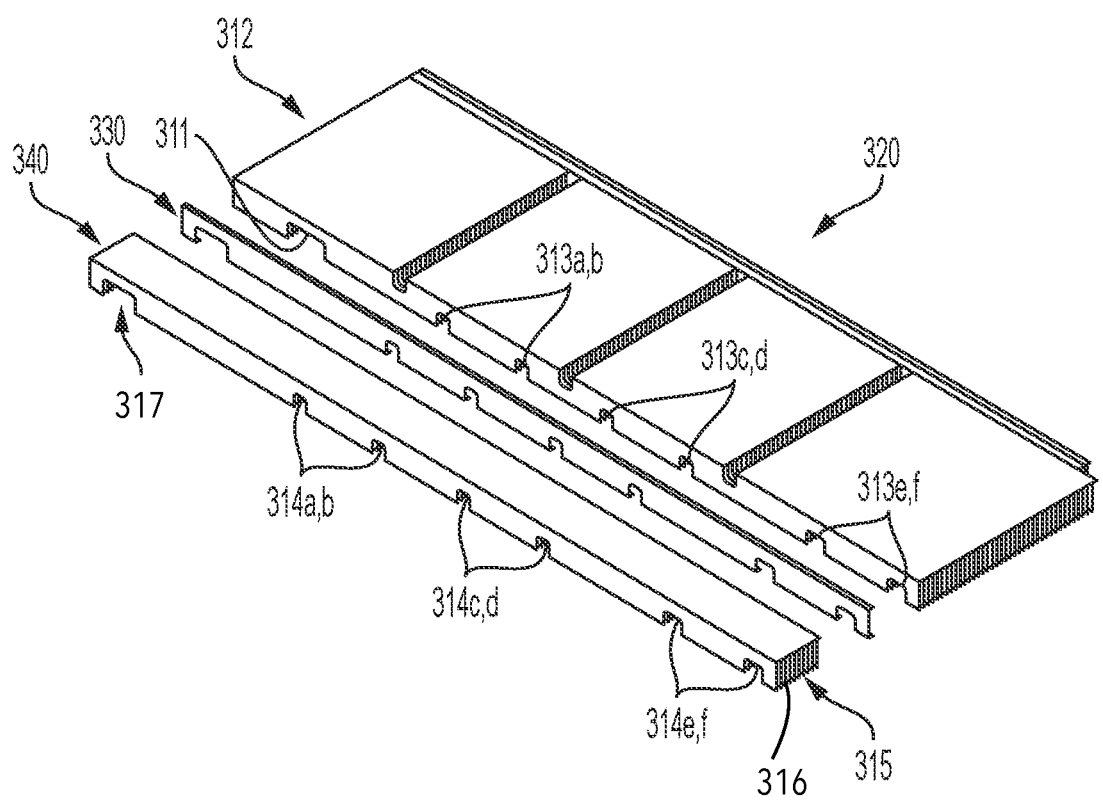
FIG. 10 shows an isometric, exploded view of the manifold structures in the condenser shown in FIGS. 1 and 2.

Turning now to FIGS. 10 through 13, aspects of a disclosed condenser are described. As FIG. 10 shows, the condenser 300 has a first manifold member 320 and a second manifold member 340. A separator 330 is positioned between the first manifold member and the second manifold member.

Figure 11:
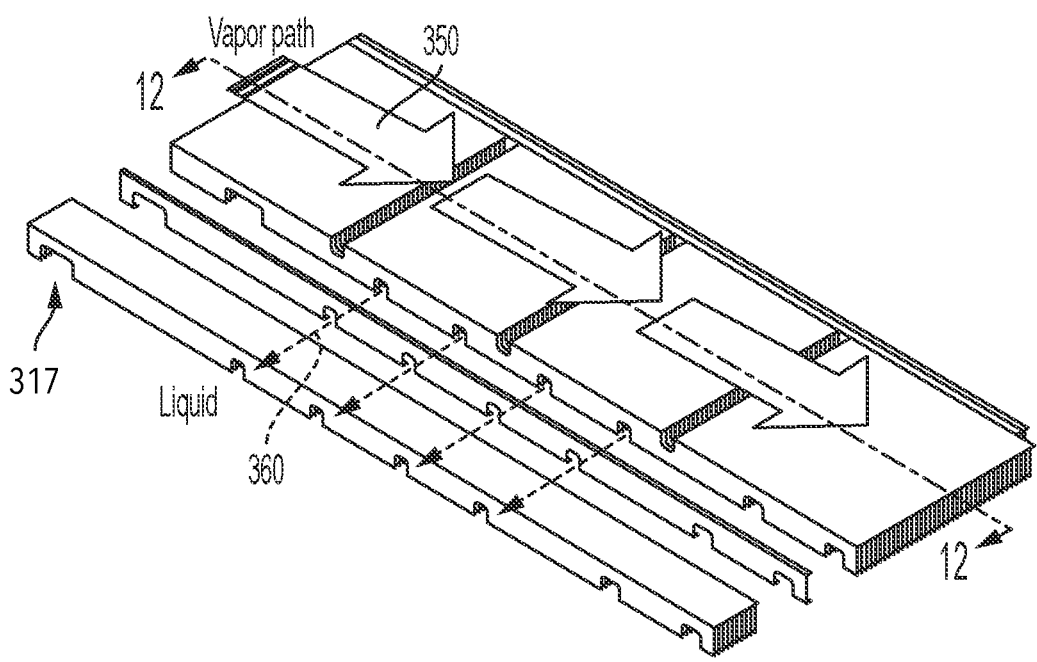
FIG. 11 shows an annotated version of FIG. 10 illustrating a flow of the working fluid through regions of the condenser manifolding structures.
Figure 12:
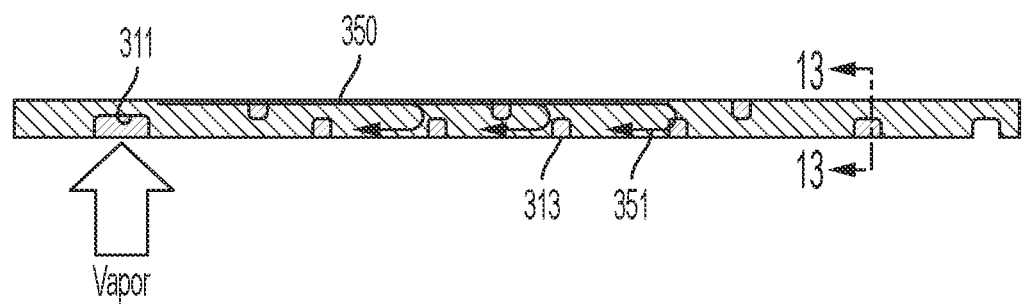
FIG. 12 shows a cross-sectional, side-elevation view of the condensing manifold structure shown in FIG. 10.
Figure 13:
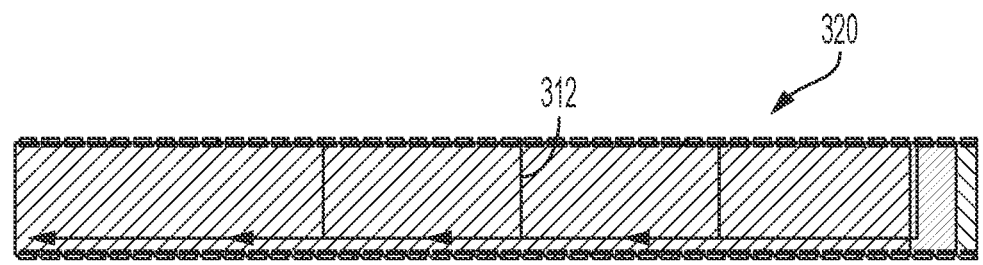
FIG. 13 shows an end-elevation view of the condensing manifold structure shown in FIG. 10.

After passing from the vapor conduit 110 through the inlet 302 (FIGS. 1 and 2), a vapor phase of the working fluid enters a vapor-inlet manifold 311 that distributes the vapor phase among a plurality of condensing channels 312 defined by the condenser 300. Each of the condensing channels 312, in turn, conveys the working fluid along the condenser, still predominantly or entirely in the vapor phase, as depicted by the arrow 350 (FIGS. 11 and 12). The working fluid, rejects substantial energy as latent heat it passes through the condensing channels 312, causing the vapor phase to condense to the liquid phase.

As the vapor phase condenses, the liquid-phase of the working fluid accumulates as indicated schematically by the segment 351 of the arrow 350. As the liquid phase accumulates within the condensing channels 312, it flows to one or more of a first plurality of liquid pathways 313a-313f oriented transversely relative to the condensing channels 312 and the fins defining those channels. The first plurality of liquid pathways 313a-313f, in turn, convey the working fluid to a second plurality of corresponding liquid pathways 314a-314f defined by the second manifold member 340, as the arrows 360 indicate. (Although six liquid pathways are indicated in the drawings, disclosed condensers may have more or fewer such liquid pathways.) Accumulating the liquid phase in or among the liquid pathways 313a-f can allow the working fluid to continue to flow through and reject heat in the condensing channels without clogging the channels with liquid.

The accumulated liquid passes into the second manifold member 340 along the liquid pathways 314a-f and enters liquid-conveyance channels 315 between adjacent fins 316 of the second manifold member. In turn, the liquid-conveyance channels 315 open to a liquid-outlet manifold 317 from which the liquid exhausts through the liquid outlet 304 and into the liquid conduit 120 (FIGS. 1 and 2).

In the embodiment shown among FIGS. 10-13, the first manifold member 320 and the second manifold member 340 includes a respective plurality of spaced-apart fins of the type described above in connection with the first manifold member 220 and second manifold member 240 of the evaporator 200. Similar to the liquid pathways 243a-d, the liquid pathways 313a-f and 314a-f can be defined by a recessed fin edge, as shown in FIGS. 10 through 12.

Like the evaporator 200, the condenser 300 includes a separator 330. The separator 330 is configured similarly to the separator 230. And, like the separator 230, the separator 330 can define an intervening manifold in the event the first manifold member 320 has more or fewer liquid pathways 313 than the second manifold member 340 has liquid pathways 314.

IV. CONDUITS

As indicated in FIGS. 1 and 2, the liquid conduit 120, the vapor conduit 110, or both, of some thermosyphons incorporate a solid-walled tube (e.g., a stainless steel or copper tube) to convey the working fluid. In other embodiments, one or both of the liquid conduit 120 and the vapor conduit 110 incorporate a flexible tubular structure to convey the working fluid. For example, a flexible conduit can include a flexible, polymer-based tube to convey the working fluid. In some embodiments, such a flexible tube has a braided or other woven structure (e.g., braided or woven metal filaments) overlying an external surface of the tube. Such an outer structure can maintain a degree of flexibility for the conduit while also inhibiting kinking or other buckling of the inner tube, as kinking or buckling of the inner tube can inhibit flow of a working fluid through the tube. As well, the outer structure can retain an outer contour of the inner tube, inhibiting or preventing the inner tube from expanding, bulging or even rupturing from the pressure of the working fluid passing through the conduit. Other embodiments include a braided or other woven structure embedded in the flexible wall of the conduit.

A liquid conduit, a vapor conduit, or both, can be divided into corresponding segments. For example, referring now to FIG. 14, the loop thermosyphon 400 incorporates a liquid conduit 420 and a vapor conduit 410 that each have two or more corresponding segments that can be coupled with and decoupled from each other. For example, the two segments 421, 422 of the liquid conduit 420 can be fluidly coupled with and fluidly decoupled from each other. Similarly, the two segments 411, 412 of the vapor conduit 410 can be fluidly coupled with and fluidly decoupled from each other.

By way of further example, the segment 421 can include a first coupler 423 and the other segment 422 can include a second coupler 424. The second coupler 424 can have a configuration complementary to that of the first coupler 423. More specifically, the segment 421 extends from a proximal end fluidly coupled with the liquid inlet 202 of the evaporator 200 to a distal end having the first coupler 423. Similarly, the segment 422 extends from a proximal end fluidly coupled with the liquid outlet 304 from the condenser to a distal end having the second coupler 424. In an embodiment, the first coupler 423 and the second coupler 424 are matingly engageable with and disengageable from each other, as with, for example, male and female quick-disconnect couplers.

Similarly, the first and second segments 411, 412 of the vapor conduit 410 can have respective first and second couplers 413, 414 that are matingly engageable with and disengageable from each other. For example, the first segment 411 can extend from a proximal end fluidly coupled with the vapor outlet 204 of the evaporator 200 to a distal end having the first coupler 413, and the second first segment 412 can extend from a proximal end fluidly coupled with the vapor inlet 302 of the condenser 300 to a distal end having the second coupler 414. The first coupler 413 and the second coupler 414 can be matingly engageable with and disengageable from each other, as with, for example, male and female quick-disconnect couplers.

A loop thermosyphon that incorporates one or more segmented conduits as just described can provide further design and installation flexibility for a loop thermosyphon.

And, a segmented conduit can make installation easier or more convenient in some applications. For example, a loop thermosyphon that will be installed in or on a tower can be hoisted aloft in separate components and assembled at or near the point of use rather than hoisted as a complete assembly. Individual components are lighter and often easier to maneuver as compared to a fully assembled loop thermosyphon.

Additionally, a segmented conduit having matingly engageable and disengageable fluid couplers can be used to charge a loop thermosyphon with a working fluid. For example, a first segment of, for example, a liquid conduit, can be fluidly coupled with an external source of a working fluid. A second segment of, for example, the liquid conduit may be fluidly couplable with the first segment, except during charging the second segment can be fluidly coupled to a waste tank or other device configured to capture excess working fluid during charging.

Once both segments are connected as just described, working fluid can be supplied to the first segment and allowed to flow into the loop thermosyphon. Concurrently with allowing the working fluid to flow into the loop thermosyphon, non-condensable gas can exhaust from the loop thermosyphon through the second segment and into the waste tank or other fluid-capture device. Once the non-condensable gas has been replaced throughout the thermosyphon by working fluid, the supply of working fluid can be discontinued, and the first segment and the second segment can be disconnected from the source of working fluid and the fluid-capture device, respectively. After such disconnection, the first segment and the second segment can be fluidly coupled with each other, providing a continuous circuit of working fluid throughout the loop thermosyphon.

V. WORKING FLUIDS

Any suitable working fluid, or refrigerant, now know or hereafter developed can be used in a loop thermosyphon of the type described herein. Desirably, such a working fluid for a loop thermosyphon provides one or more of a large difference in fluid density between the gas phase and the liquid phase, relatively high latent heat, and a moderate saturation pressure, particularly at or near a desired range of operating temperatures for the working fluid in a given application. For example, some electronic components have an upper threshold temperature of about 85° C. Consequently, a working fluid in a thermosyphon may operate at or near 85° C. when used to cool such an electronic component. Other components, of course, have different upper threshold temperatures, and thus a working fluid in a thermosyphon used to cool these other components may operate at or near a temperature other than 85° C.

As noted above, the difference in density between the vapor phase and the liquid phase, combined with a difference in elevation between the evaporator and the condenser, results in forces that urge the flow of working fluid through a given loop thermosyphon. Consequently, for a given elevation difference, a relatively larger difference in density between the vapor phase and the liquid phase will provide a relatively higher flow rate of working fluid through the thermosyphon.

Examples of working fluids suitable for use in a thermosyphon include R-134a, R-1234yf, and mixtures thereof. That being said, the American Society of Heating, Refrigerating and Air-Conditioning Engineers (ASHRAE) maintains a compendium of hundreds of refrigerants and their physical properties. Any such refrigerant or analog thereto may be used as a working fluid in a disclosed thermosyphon. A person of ordinary skill in the art following a review of this disclosure will understand and appreciate how to select and incorporate any such refrigerant in a loop thermosyphon of the type described herein without undue experimentation.

VI. SYSTEM EXAMPLES

Figure 15:
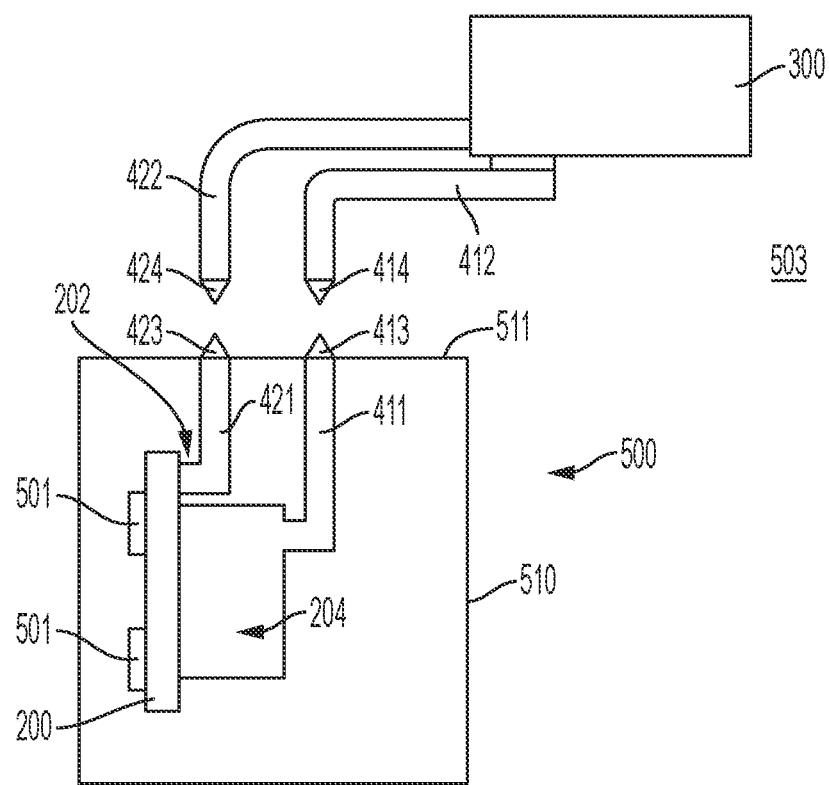
FIG. 15 shows an electrical device incorporating a loop thermosyphon as shown in FIG. 14.

FIG. 15 shows an electrical device having one or more components cooled by a loop thermosyphon of the type described herein. The illustrated electrical device 500 has first and second electrical components 501 that dissipate heat during operation and have an upper temperature threshold for reliable operation. By way of example, the electrical device 500 is placed in and protected from an environment 503 by a housing, or chassis, 510.

Figure 14:
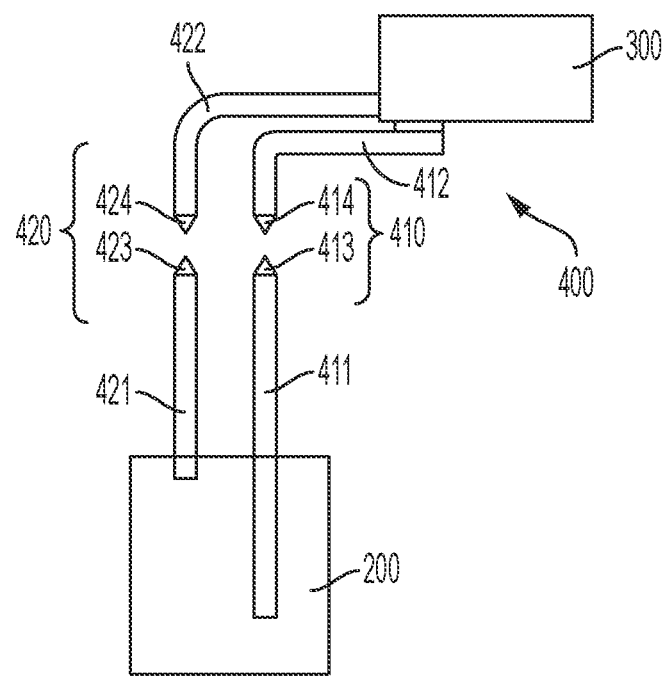
FIG. 14 shows another embodiment of a loop thermosyphon.

The electrical components 501 are thermally coupled with and cooled by a loop thermosyphon, e.g., the loop thermosyphon 400 shown in FIG. 14. More specifically, the electrical components 501 are thermally coupled with an external surface of the base 201a of the evaporator housing 201 (FIG. 4). For example, a thermal interface material, e.g., a thermally conductive grease, pad, gel, solder, etc., can be disposed between the heat-transfer surface of the evaporator and a corresponding heat-transfer surface defined by the electrical components 501. Although two electrical components 501 are shown in FIG. 15, an electrical device can have just one electrical component 501 or can have 2, 3, 4, 5, 6, 7, 8 or more electrical components 501 cooled by the loop thermosyphon 400. Moreover, the electrical components 501 may be substantially identical to each other, or one or more of the electrical components can be different from one or more of the other electrical components. Further, a group more than one of the electrical components 501 can be packaged together (e.g., as part of a multi-chip module). Still further, other of the electrical components 501 can be packaged separately from the group of electrical components 501 that are packaged together. For example, a single package of an electrical device can have one or more "chiplets," each of which chiplets is placed into thermal contact with the evaporator (or an augmented thermal contact). In such an embodiment, one or more of the chiplets may be packaged under an integrated heat spreader (IHS) and the IHS can be placed into thermal contact with the evaporator (or the augmented thermal contact). Still further, one or more of the chiplets may have a bare die placed into thermal contact with the evaporator (or the augmented thermal contact). In some system embodiments, each of the electrical components is placed under an IHS, which is placed into thermal contact with the evaporator (or the augmented thermal contact). In some system embodiments, each of the electrical components has a bare die, which is placed into thermal contact with the evaporator (or the augmented thermal contact). In still other system embodiments, one or more of the electrical components is placed under an IHS, which is placed into thermal contact with the evaporator (or the augmented thermal contact), and one or more other of the electrical components has a bare die, which is placed into thermal contact with the evaporator (or the augmented thermal contact).

The evaporator is oriented in a manner that the liquid inlet 202 is positioned at an elevation (relative to gravity) above an elevation of the evaporator's vapor outlet 202. This elevation difference can aid in passively driving the flow of working fluid through the condenser 200.

Similarly, externally of the housing 510, the condenser 300 is positioned at an elevation (relative to gravity) above an elevation of the evaporator. This orientation allows the relatively less dense vapor phase to rise against gravity while allowing the relatively denser liquid phase to fall with gravity, further urging the self-sustained flow of working fluid through the loop thermosyphon 400. Additionally, the vapor inlet to the condenser 300 is positioned at a relatively higher elevation than the liquid outlet from the condenser, again, allowing gravity to aid in urging the working fluid throughout the loop thermosyphon.

As also shown in FIG. 15, the first segment 411 of the vapor conduit 410 and the first segment 421 of the liquid conduit 420 extend from the evaporator 200 to an interface boundary 511 defined by the electrical device 500. More particularly, in this embodiment, the fluid couplers 412, 423 are retained in place by the housing 510, which provides several advantages. For example, the electrical device 500 can maintain an environmentally sealed enclosure around the electrical components 501, protecting the components 501 (and other components of the system 500) from the environment 503. For example, the enclosure 510 can be an IP ("ingress protection") enclosure.

By retaining the fluid couplers 413, 423 at an interface boundary, the electrical device 500 can be manufactured and assembled in a factory, while permitting an installation technician later to complete assembly of the cooling system (e.g., the loop thermosyphon 400) by coupling the second segments 412, 422 with the first segments 411, 421, e.g., by coupling the second couplers 414, 424 with the first couplers 413, 423, respectively.

Figure 16:
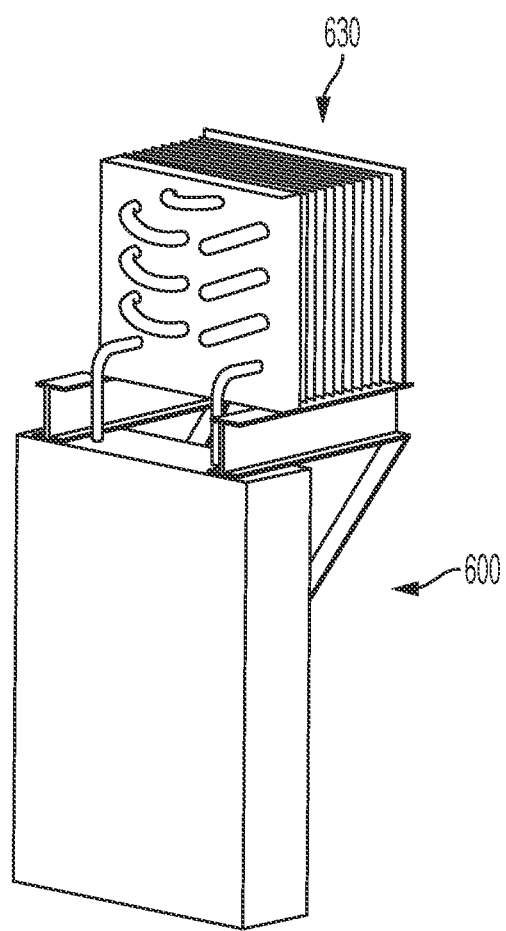
FIG. 16 shows another electrical device incorporating yet another embodiment of a loop thermosyphon.

FIG. 16 shows an isometric view of a rendering of a system 600 similar to that just described in relation to FIG. 15. The system 600 has two primary differences from that shown in FIG. 15: (1) the liquid and vapor conduits in FIG. 16 are of a continuous, non-segmented type; and (2) the condenser 630 is configured as a tube-fin heat exchanger rather than a condenser having internal manifold structures as described above in connection with FIGS. 10 through 13. The tube-and-fin type condenser conveys the vapor phase of the working fluid from the evaporator through a condenser coil. The external fins provide an extended heat-transfer surface from the condenser coil, allowing the working fluid to reject latent heat through the walls of the condenser coil, into the fins, and ultimately to another medium passing over the fins, e.g., environmental air. As the working fluid rejects latent heat, the vapor phase condenses to the liquid phase and flows down the liquid conduit, returning to the evaporator 200 within the chassis of the system 600.

VII. OTHER EMBODIMENTS

The examples described above generally concern apparatus, methods, and related systems to move heat from one medium to another using a loop thermosyphon. More particularly, but not exclusively, disclosed principles pertain to systems, methods, and components to cool electrical or other heat-dissipating components using a passive heat-transfer loop, e.g., a loop thermosyphon.

Figure 17:
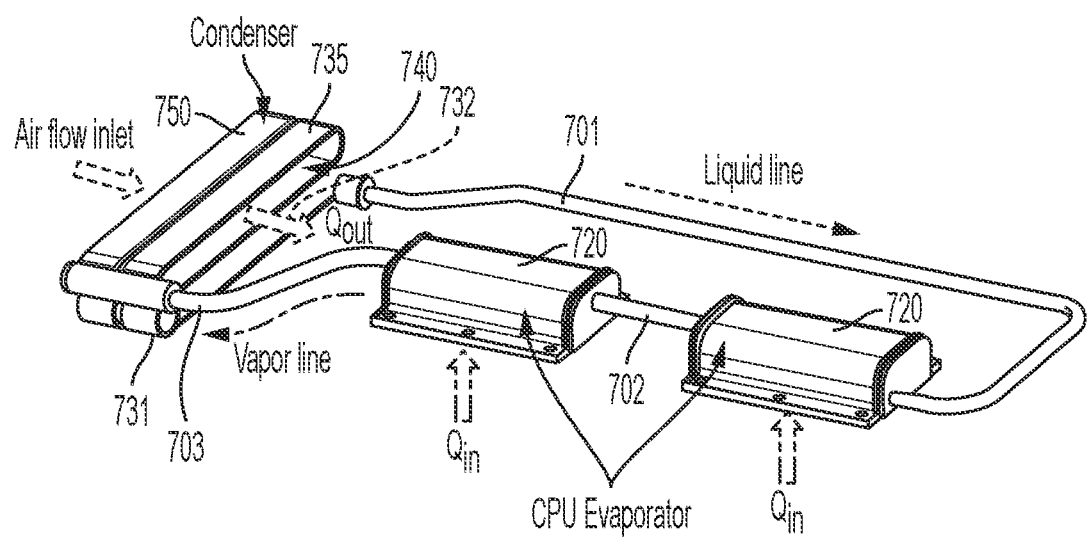
FIG. 17 shows yet another embodiment of a loop thermosyphon.

Referring again to FIGS. 1 and 2, the loop thermosyphon 100 has one evaporator and one condenser. However, a loop thermosyphon is not so limited. For example, referring to FIG. 17, a loop thermosyphon 700 is shown having a plurality of evaporators fluidly coupled with each other in series (i.e., working fluid that passes through one of the evaporators also passes through the other evaporator(s) serially, one-at-a-time). For example, the working fluid enters the first evaporator 710, absorbing heat $Q_{in}$ and exhausting a saturated mixture of vapor and liquid to the first vapor line 702, which then enters the second evaporator 720 and absorbs further heat $Q_{in}$. The vapor exhausts from the second evaporator 720 to the second vapor line 703 and flows into the condenser 730, where the working fluid rejects latent heat and condenses to the liquid phase, which flows through the liquid conduit back to the first evaporator 710. The condenser 730 can be configured similarly to the condenser 300, the condenser 630, or can be configured more similarly to a multi-pass radiator (e.g., an automotive radiator). A multi-pass-type condenser can have a flow-path 735 for the working fluid that sinuously winds back-and-forth between a proximal end positioned adjacent the vapor inlet 731 and a distal end positioned adjacent the liquid outlet 732. Between each leg of the flow-path 735, an array of corrugated or other fins 740 can extend outwardly from the flow path, providing an extended heat-transfer surface over which a heat-sink medium (e.g., air) can flow, removing latent heat from the working fluid and transferring that heat to the heat-sink medium. As the working fluid rejects the latent heat, it condenses to the liquid phase and flows through the liquid conduit 701.

Despite the description of certain details of loop thermosyphons and electrical devices cooled by them, the previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

For example, a loop thermosyphon can have more or fewer evaporators or condensers than the specific examples described above. Further, some conduits can include a flexible segment between substantially rigid segments, allowing some measure of installation flexibility.

Further, one particular example of an electrical device having components cooled by a loop thermosyphon was described for illustrative purposes. Nonetheless, other system configurations and types can be cooled or heated using a loop thermosyphon of the type described herein. For example, one or more electrical components in a 1U (or even a ½-U) server (or other electronic device, such as, for example, a 5G cellular radio, a power generation or transmission device) can be cooled by a loop thermosyphon as described herein. That is to say, even a small elevation difference provided by a ½-U server can be sufficient to urge a self-sustained, passive flow of a working fluid through a loop thermosyphon as described herein. Many other types of electrical devices, such as, for example, a graphics processor, a television, power electronics devices, communications transmission devices and other networking devices, among others, have heat-dissipating devices that can be cooled by a passive loop thermosyphon as described. As but one particular example, one or more heat-dissipating components in a communications or other network device (e.g., a so-called 5 G transmission device) can be passively cooled with a loop thermosyphon as described. Similarly, some electrical storage batteries dissipate substantial amounts of heat while discharging or charging. For example, some batteries that can store substantial amounts of energy, e.g., a 5 kW-h to 50 kW-h battery, can be passively cooled with a loop thermosyphon as described.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface, and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of loop thermosyphon devices and components thereof, as well as related methods and systems. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of components, devices, systems, and related methods that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

We currently claim:

1. A loop thermosyphon device, comprising:
   an evaporator and a condenser fluidly coupled with each other by a first conduit and a second conduit;
   a first manifold positioned in the evaporator and defining a first plurality of liquid pathways and a second plurality of liquid pathways, the first manifold fluidly coupled with the first conduit; and
   a second manifold positioned in the evaporator and defining a third plurality of liquid pathways and a fourth plurality of liquid pathways, the third plurality of liquid pathways fluidly coupled with and extending from the first plurality of liquid pathways and the fourth plurality of liquid pathways fluidly coupled with and extending from the second plurality of liquid pathways, the second manifold further defining:
   a plurality of boiling channels extending transversely relative to and fluidly coupled with the third plurality of liquid pathways and the fourth plurality of liquid pathways, the plurality of boiling channels being defined among a corresponding plurality of corrugated fins, the corrugated fins defining at least a top cap;
   a plurality of accumulator channels extending transversely relative to and fluidly coupled with the plurality of boiling channels, the plurality of accumulator channels being positioned between the third plurality of liquid pathways and the fourth plurality of liquid pathways, wherein an aperture extends through each of the plurality of corrugated fins, each aperture aligned with at least one other aperture to define at least one of the plurality of accumulator channels, wherein at least one other of the plurality of accumulator channels being defined by a recess from the top cap in each of the plurality of corrugated fins; and
   a vapor manifold defined by an open segment of the top cap, the open segment of the top cap adjoining the recess defining the at least one other of the plurality of accumulator channels such that the vapor manifold opens from one or more of the plurality of boiling channels and one or more of the plurality of accumulator channels, wherein the evaporator further defines an outlet fluidly coupling the vapor manifold with the second conduit,
   wherein the condenser defines a fluid chamber and comprises a housing, the fluid chamber being positioned in the housing.

2. The loop thermosyphon device of claim 1, wherein the evaporator defines a fluid chamber and comprises a housing, the fluid chamber of the evaporator being positioned in the housing of the evaporator.

3. The loop thermosyphon device of claim 2, wherein the first manifold comprises a plurality of fins positioned in the fluid chamber of the evaporator, the plurality of fins defining a proximal edge and a distal edge, the proximal edge of each fin being thermally coupled with the housing of the evaporator and defining a recess corresponding to each in the first plurality of liquid pathways and the second plurality of liquid pathways.

4. The loop thermosyphon device of claim 3, wherein each in the first plurality of liquid pathways extends transversely relative to the plurality of fins.

5. The loop thermosyphon device of claim 3, wherein adjacent ones of the plurality of fins are spaced apart from each other, defining a corresponding plurality of fluid-distribution channels, each fluid-distribution channel positioned between adjacent fins and extending transversely relative to the first plurality of liquid pathways.

6. The loop thermosyphon device of claim 5, wherein each respective fluid-distribution channel between adjacent fins has an enclosed region adjacent the distal edges of the fins and an open region adjacent the distal edges of the fins, wherein the housing defines an inlet fluidly coupling the first fluid conduit with the open region of each respective fluid-distribution channel.

7. The loop thermosyphon device of claim 2, wherein the second manifold comprises a plurality of fins positioned in the fluid chamber of the evaporator, the plurality of fins defining a proximal edge and a distal edge, the proximal edge of each fin being thermally coupled with the housing of the evaporator and defining a recess corresponding to each in the third plurality of liquid pathways and the fourth plurality of liquid pathways.

8. The loop thermosyphon device of claim 7, wherein each in the third plurality of liquid pathways extends transversely relative to the plurality of fins of the second manifold.

9. The loop thermosyphon device of claim 7, wherein adjacent ones of the plurality of fins of the second manifold are spaced apart from each other, defining the plurality of boiling channels between adjacent fins.

10. The loop thermosyphon device according to claim 9, wherein each of the plurality of fins defines a notch corresponding to each respective accumulator channel.

11. The loop thermosyphon device of claim 9, wherein each of the plurality of boiling channels has an enclosed region adjacent the distal edges of the fins and an open region adjacent the distal edges of the fins, each open region defining an inlet to the vapor manifold.

12. The loop thermosyphon device of claim 11, wherein the housing of the evaporator defines the outlet.

13. The loop thermosyphon device of claim 11, wherein the outlet extends across more than one of the open regions of the boiling channels.

14. The loop thermosyphon device of claim 1, wherein the first conduit comprises a first segment and a second segment, wherein the first segment extends from a proximal end fluidly coupled with the condenser to a distal end having a first fluid coupler.

15. The loop thermosyphon device of claim 14, wherein the second segment extends from a proximal end fluidly coupled with the evaporator to a distal end having a second fluid coupler.

16. The v device of claim 15, wherein the first fluid coupler and the second fluid coupler are so complementarily configured relative to each other as to be matingly engageable with each other to provide a fluid connection between the first segment and the second segment.

17. The loop thermosyphon device of claim 1, wherein one or both of the first conduit and the second conduit comprises a corresponding first segment configured to fluidly couple with and decouple from a corresponding second segment.

18. The loop thermosyphon device of claim 1, wherein one or both of the first conduit and the second conduit is configured to fluidly couple with and decouple from the first heat-transfer component, the second heat-transfer component, or both.

19. The loop thermosyphon device of claim 1, wherein the condenser comprises:
a first condenser manifold positioned in the fluid chamber and defining a vapor-distribution channel, the first condenser manifold fluidly coupled with the second conduit and further defining:
a plurality of condensing channels extending transversely relative to and fluidly coupled with the vapor-distribution channel; and
a first plurality of liquid-accumulation channels extending transversely relative to and fluidly coupled with the plurality of condensing channels;
wherein the condenser further comprises:
a second condenser manifold positioned in the fluid chamber and defining a second plurality of liquid-accumulation channels fluidly coupled with and extending from the first plurality of liquid-accumulation channels, the second condenser manifold further defining a liquid-outlet manifold and a plurality of liquid-conveyance channels configured to convey liquid from one or more of the second plurality of liquid-accumulation channels to the liquid-outlet manifold; and
an outlet fluidly coupling the liquid-outlet manifold with the first conduit.

20. The loop thermosyphon device of claim 19, further comprising a condenser housing defining a condenser chamber, wherein the first condenser manifold comprises a plurality of condenser fins positioned in the condenser chamber, the plurality of condenser fins defining a proximal edge and a distal edge, the proximal edge of each condenser fin being thermally coupled with the condenser housing and defining a recess corresponding to each in the first plurality of liquid-accumulation channels.

21. The loop thermosyphon device of claim 20, wherein each in the first plurality of liquid-accumulation channels extends transversely relative to the plurality of condenser fins.

22. The loop thermosyphon device of claim 20, wherein adjacent ones of the plurality of condenser fins are spaced apart from each other, defining a corresponding plurality of condensing channels between adjacent condenser fins and extending transversely relative to the vapor-distribution channel.

23. The loop thermosyphon device of claim 19, wherein the plurality of condenser fins is a first plurality of condenser fins and the second manifold comprises a second plurality of condenser fins positioned in the condenser chamber, the second plurality of condenser fins defining a proximal edge and a distal edge, the proximal edge of each second condenser fin being thermally coupled with the housing and defining a recess corresponding to each in the second plurality of liquid-accumulation channels.

24. The loop thermosyphon device of claim 23, wherein each in the second plurality of liquid-accumulation channels extends transversely relative to the second plurality of condenser fins.

25. The loop thermosyphon device of claim 23, wherein the proximal edge of each second condenser fin further defines a recess corresponding to the liquid-outlet manifold.

26. A heat-transfer device, comprising:
a first heat-transfer component and a second heat-transfer component fluidly coupled with each other by a first conduit and a second conduit;
a first manifold positioned in the first heat-transfer component and coupled with the first conduit;
a second manifold positioned in the first heat-transfer component; and
a separator positioned between the first manifold and the second manifold, wherein a first plurality of liquid pathways extends across a portion of the first manifold, through the separator, and across a portion of the second manifold, coupling the portion of the first manifold with the portion of the second manifold, wherein a second plurality of liquid pathways extends across another portion of the first manifold, through the separator, and across another portion of the second manifold, coupling the other portion of the first manifold with the other portion of the second manifold, wherein the second manifold further comprises:
- a plurality of boiling channels extending transversely relative to and fluidly coupled with the first and second pluralities of liquid pathways, the plurality of boiling channels being defined among a corresponding plurality of fins;
- a cap defining an outer wall of each in the plurality of boiling channels, the cap defining an aperture in fluid communication with each respective boiling channel in the plurality of boiling channels;
- a plurality of accumulator channels extending transversely relative to and fluidly coupled with the plurality of boiling channels, at least one of the plurality of accumulator channels being recessed from the cap and positioned laterally adjacent to the cap's aperture, wherein at least one other of the plurality of accumulator channels is defined by an aperture through each of the plurality of fins; and
- a vapor manifold defined by the cap's aperture and being contiguous with the at least one of the accumulator channels being recessed from the cap, the vapor manifold being configured to collect vapor from one or more of the plurality of boiling channels and the at least one of the accumulator channels being recessed from the cap through the aperture defined by the cap, wherein the first heat-transfer component further defines an outlet from the vapor manifold, fluidly coupling the vapor manifold with the second conduit.

27. The heat-transfer device according to claim 26, wherein the second heat-transfer component defines a fluid chamber and comprises a housing, the fluid chamber being positioned in the housing.

28. The loop thermosyphon device of claim 26, wherein the first heat-transfer component comprises an evaporator and the second heat-transfer component comprises a condenser.

29. The loop thermosyphon device of claim 28, wherein the condenser comprises a fin-tube heat exchanger having a plurality of fins extending transversely from a plurality of tubes, the fin-tube heat exchanger configured to convey a working fluid through the tubes and to direct air over the fins, removing heat from the working fluid passing through the tubes.

* * * * *